(12) United States Patent
Endo et al.

(10) Patent No.: US 10,436,859 B2
(45) Date of Patent: Oct. 8, 2019

(54) NMR SAMPLE TUBE INTRODUCING AND COLLECTING APPARATUS, AND NMR SAMPLE TUBE INTRODUCING AND COLLECTING METHOD

(71) Applicant: JEOL Ltd., Tokyo (JP)

(72) Inventors: Yuki Endo, Tokyo (JP); Masahide Nishiyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 80 days.

(21) Appl. No.: 15/913,056

(22) Filed: Mar. 6, 2018

(65) Prior Publication Data

US 2018/0259602 A1 Sep. 13, 2018

(30) Foreign Application Priority Data

Mar. 7, 2017 (JP) .................................. 2017-043087

(51) Int. Cl.
*G01R 33/30* (2006.01)
*G01R 33/44* (2006.01)
*G01R 33/31* (2006.01)

(52) U.S. Cl.
CPC ........... *G01R 33/307* (2013.01); *G01R 33/31* (2013.01); *G01R 33/44* (2013.01)

(58) Field of Classification Search
CPC ....... G01R 33/307; G01R 33/31; G01R 33/44
See application file for complete search history.

(56) References Cited

U.S. PATENT DOCUMENTS

| | | | | |
|---|---|---|---|---|
| 4,859,948 A * | 8/1989 | Kuster | ................... | G01R 33/28 324/318 |
| 5,146,166 A * | 9/1992 | Bartuska | .............. | G01R 33/307 324/321 |
| 5,200,702 A * | 4/1993 | Lilly | .................... | G01R 33/307 324/321 |
| 5,534,780 A * | 7/1996 | Lilly | .................... | G01R 33/307 324/321 |
| 7,019,526 B2 * | 3/2006 | Lukens | ................... | G01R 33/30 324/300 |
| 8,217,655 B2 * | 7/2012 | De Vries | .............. | G01R 33/307 324/321 |
| 9,903,923 B2 * | 2/2018 | Schett | .................. | G01R 33/307 |

(Continued)

FOREIGN PATENT DOCUMENTS

JP 2013167463 A 8/2013
JP 6033343 B2 11/2016

*Primary Examiner* — G. M. A Hyder
(74) *Attorney, Agent, or Firm* — The Webb Law Firm

(57) ABSTRACT

A sample tube carrier includes a housing space in which a sample tube can be accommodated, and a locking mechanism constituted by a valve and a spring. When introducing a sample tube, the sample tube carrier is mounted on one end of a sample tube passage member communicating with an NMR probe device and the one end comes into contact with the valve and brings the valve into an opened state, thereby introducing the sample tube into the NMR probe device through the sample tube passage member. When collecting the sample tube, gas is jetted into the sample tube passage member toward the housing space and the gas pressure acts to discharge the sample tube from the NMR probe device to the housing space through the sample tube passage member.

11 Claims, 24 Drawing Sheets

(56) References Cited

U.S. PATENT DOCUMENTS

| | | | |
|---|---|---|---|
| 2002/0196023 A1* | 12/2002 | Hofmann | G01R 33/30 |
| | | | 324/321 |
| 2007/0202017 A1* | 8/2007 | Himmelsbach | G01R 33/307 |
| | | | 422/527 |
| 2013/0207656 A1 | 8/2013 | Shinagawa et al. | |
| 2015/0204952 A1 | 7/2015 | Schett et al. | |

* cited by examiner ated on Mar. 7, 2017, the disclosure
NMR SAMPLE TUBE INTRODUCING AND COLLECTING APPARATUS, AND NMR SAMPLE TUBE INTRODUCING AND COLLECTING METHOD

CROSS REFERENCE TO RELATED APPLICATION

This application claims priority to Japanese Patent Application No. 2017-043087 filed on Mar. 7, 2017, the disclosure of which is hereby incorporated by reference in its entirety.

TECHNICAL FIELD

The present disclosure relates to introducing and/or collecting a nuclear magnetic resonance (NMR) sample tube into and/or from an NMR probe device used for NMR measurement.

BACKGROUND

An NMR apparatus is configured to apply a static magnetic field to an atomic nucleus having a spin magnetic moment to generate a Larmor precession in its spin magnetic moment and cause the atomic nucleus to resonate by irradiating the atomic nucleus with high-frequency electromagnetic waves comparable to the precession, thereby detecting a signal of the atomic nucleus having the spin magnetic moment.

Magic Angle Spinning (MAS) method is an exemplary method generally employed when solid samples are subjected to the NMR measurement. The MAS method includes detecting an NMR signal by rotating a sample tube accommodating a solid sample at higher speeds in a state where the sample tube is inclined at a predetermined angle (magic angle of approximately 54.7°) with respect to the direction of the static magnetic field.

The NMR probe device that implements the MAS method (hereinafter, referred to as "MAS probe device") is inserted into an elongated hole-like measurement space of a magnetic field generator represented by a superconducting magnet and subjected to the NMR measurement. The MAS probe device includes a sample tube supporter where the sample tube accommodating a solid sample can be disposed in an inclined state at the magic angle with respect to the magnetic field. The sample tube supporter is for supporting the sample tube during the measurement and precisely regulating its posture and motion.

In the MAS probe device, precise adjustment of the magic angle is necessary. However, the adjusted value may cease being accurate if the MAS probe device is once taken out from the magnetic field generator when introducing the sample tube into the MAS probe device. This is the reason why performing readjustment is required. To solve such drawback, there is a conventionally proposed technique capable of replacing the sample tube in a state where the MAS probe device is attached to the magnetic field generator.

According to the MAS probe device discussed in JP 2013-167463 A, when introducing a sample tube, by inserting the sample tube into a sample inlet provided at an upper part of the MAS probe device, the sample tube moves down through a tubular sample tube passage mainly due to gravity and arrives at a sample tube supporter in the MAS probe device. When collecting the sample tube, gas pressure acts to lift the sample tube upward and discharge the sample tube from the upper part of the MAS probe device via the sample inlet.

In above-mentioned MAS probe device discussed in JP 2013-167463 A, it is assumed that an operator is continuously grasping the sample tube by hand until the sample tube enters the sample inlet. Such manual operations tend to be disturbed with dust and contamination. Further, when the sample tube is taken out, the sample tube is pushed upward by gas pressure and discharged via the sample inlet while keeping its momentum. In this case, the sample tube may collide with a container covering the sample inlet and consequently the sample tube may be damaged. In addition, as each sample tube is a very thin container, it is not easy to distinguish one sample tube from another sample tube.

SUMMARY

The present disclosure intends to facilitate handling and managing each sample tube when introducing the sample tube into an NMR probe device and also when collecting the sample tube from the NMR probe device.

The present disclosure provides an NMR sample tube introducing and collecting apparatus, including a sample tube carrier including a housing space in which a sample tube to be subjected to NMR measurement can be accommodated and a locking mechanism for holding the sample tube in the housing space, a sample tube passage having a tubular shape and communicating with an NMR probe device, wherein the sample tube passage is configured to have one end that comes into contact with the locking mechanism and unlocks the locking mechanism when the sample tube carrier is mounted, and a jetting member for jetting gas into the sample tube passage so as to flow from the other end of the sample tube passage toward the one end. When introducing the sample tube, the sample tube carrier is mounted on the one end and the locking mechanism is unlocked upon the one end coming into contact with the locking mechanism, thereby introducing the sample tube from the housing space into the NMR probe device through the sample tube passage. When collecting the sample tube, in a state where the sample tube carrier is mounted on the one end and the locking mechanism is unlocked, the jetting member jets gas from the other end toward the one end and pressure of the jetted gas acts to discharge the sample tube from the NMR probe device to the housing space through the sample tube passage.

According to the above-mentioned configuration, when introducing a sample tube, by mounting the sample tube carrier on one end of the sample tube passage, the locking mechanism is unlocked and the sample tube is conveyed into the NMR probe device. Further, when collecting a sample tube, by supplying gas into the sample tube passage, the sample tube is discharged from the NMR probe device to the sample tube carrier. As a result, the operator is not required to directly grasp the sample tube itself when introducing the sample tube into the NMR probe device or collecting the sample tube from the NMR probe device. Therefore, for example, it is feasible to solve the problems of dust and contamination that may be caused by manual operations. In addition, using the sample tube carrier can facilitate the management of the sample tube. The sample tube passage not only functions as a passage for introducing the sample tube into the NMR probe device and collecting the sample tube from the NMR probe device but also functions as a switch for unlocking or locking the locking mechanism. The sample tube carrier is, for example, not fixed to the one end of the sample tube passage in its mounting state. As a result, when gas pressure is applied, the sample tube carrier can easily move in a direction departing from the sample tube passage. Even when an impact force is applied to the sample tube carrier when the sample tube is discharged into the housing space, the sample tube carrier itself can move together with the sample tube. Such an integral movement can relax the impact and suppress or prevent the sample tube from being damaged. The sample tube carrier may be manually mounted on the one end of the sample tube passage by the operator or may be automatically mounted on the one end by an automatic sample changer or the like.

The sample tube carrier further includes a passage connecting the housing space and the outside of the sample tube carrier, and the one end of the sample tube passage can be inserted into the passage of the sample tube carrier when the sample tube carrier is mounted on the one end. The locking mechanism is an opening/closing valve provided in the passage of the sample tube carrier. When the sample tube carrier is mounted on the one end of the sample tube passage, the one end is inserted into the passage of the sample tube carrier and comes into contact with and pushes the valve to bring the valve into an opened state. As a result, the housing space and the sample tube passage communicate with each other, and in this state, operations for introducing the sample tube from the housing space into the NMR probe device and collecting the sample tube from the NMR probe device to the housing space may be performed.

In the above-mentioned configuration, the valve closes the passage when receiving an urging force from an elastic member, such as a spring. When the one end of the sample tube passage comes into contact with the valve, a force exceeding the urging force is applied to the valve and brings the valve into the opened state. In this manner, the sample tube passage functions as a switch for opening and closing the valve. Therefore, the sample tube carrier itself is not required to include a dedicated switch configuration. The locking mechanism can be configured to have such a simplified configuration.

When the sample tube carrier is detached from the one end of the sample tube passage in the state where the sample tube is accommodated in the housing space, the one end of the sample tube passage is disengaged from the valve to bring the valve into a closed state, thereby confining the sample tube in the housing space.

According to the above-mentioned configuration, the valve automatically closes upon detaching the sample tube carrier from the one end of the sample tube passage. The handling becomes easy.

An opening is formed on a wall surface that constitutes the housing space. When collecting the sample tube, pressure of the gas supplied from the jetting member acts to discharge the sample tube into the housing space and closes the opening. As a result, the gas pressure causes the sample tube carrier to move in the direction departing from the one end of the sample tube passage, thereby disengaging the one end from the valve to bring the valve into the closed state.

According to the above-mentioned configuration, the gas pressure automatically detaches the sample tube carrier. The handling becomes easy. In addition, in the state where the sample tube does not close the opening, the opening enables the gas to exit to the outside of the housing space. Therefore, the sample tube carrier can be suppressed or prevented from moving in the direction departing from the one end when receiving the gas pressure. As a result, the sample tube carrier can stay at the one end of the sample tube passage until the sample tube is positioned in the housing space. Thus, a situation that the sample tube cannot be discharged into the housing space can be avoided.

The valve may be disposed inclined with respect to the passage.

When collecting the sample tube, an impact force due to gas pressure acting in discharging the sample tube into the housing space may cause the sample tube carrier to shift in the direction departing from the one end of the sample tube passage.

According to the above-mentioned configuration, since the movement of the sample tube carrier can relax the impact, the sample tube can be suppressed or prevented from being damaged due to the impact.

At least one through hole for passing the gas jetted from the jetting member to the outside may be formed in an outer peripheral region of the housing space.

The sample tube is a solid NMR sample tube in which a solid sample can be accommodated, and the sample tube carrier is a member capable of accommodating and holding the solid NMR sample tube in the housing space and having an exterior shape common to a holding member for holding a solution NMR sample tube accommodating a solution sample.

According to the above-mentioned configuration, the apparatus handling solution NMR sample tubes can handle the sample tube carrier.

A common conveying apparatus may convey to an NMR apparatus the sample tube carrier and the solution NMR sample tube held by the holding member from a storage container storing the sample tube carrier and the solution NMR sample tube.

The storage container may have a function of adjusting the temperature of the sample tube. Since the sample tube is confined in the sample tube carrier, undesirable temperature change of the sample tube can be suppressed or prevented, as compared to the case where the sample tube is conveyed to the NMR apparatus without being housed in the sample tube carrier.

Further, the present disclosure provides an NMR sample tube introducing and collecting method, including when introducing a sample tube to be subjected to NMR measurement, mounting a sample tube carrier including a housing space in which the sample tube is accommodated and a locking mechanism for holding the sample tube in the housing space on one end of a sample tube passage having a tubular shape and communicating with an NMR probe device to cause the one end to come into contact with the locking mechanism and unlock the locking mechanism, and introducing the sample tube from the housing space to the NMR probe device through the sample tube passage in a state where the locking mechanism is in an unlocked state, and when collecting the sample tube, jetting gas into the sample tube passage so as to flow from the other end of the sample tube passage toward the one end in a state where the sample tube carrier is mounted on the one end of the sample tube passage and the locking mechanism is unlocked, thereby causing the gas pressure to discharge the sample tube from the NMR probe device to the housing space through the sample tube passage.

According to the present disclosure, handling and managing a sample tube becomes easy when the sample tube is introduced into or taken out from the NMR probe device.

BRIEF DESCRIPTION OF DRAWINGS

Embodiment(s) of the present disclosure will be described by reference to the following figures, wherein.

DESCRIPTION OF EMBODIMENTS

Figure 1:
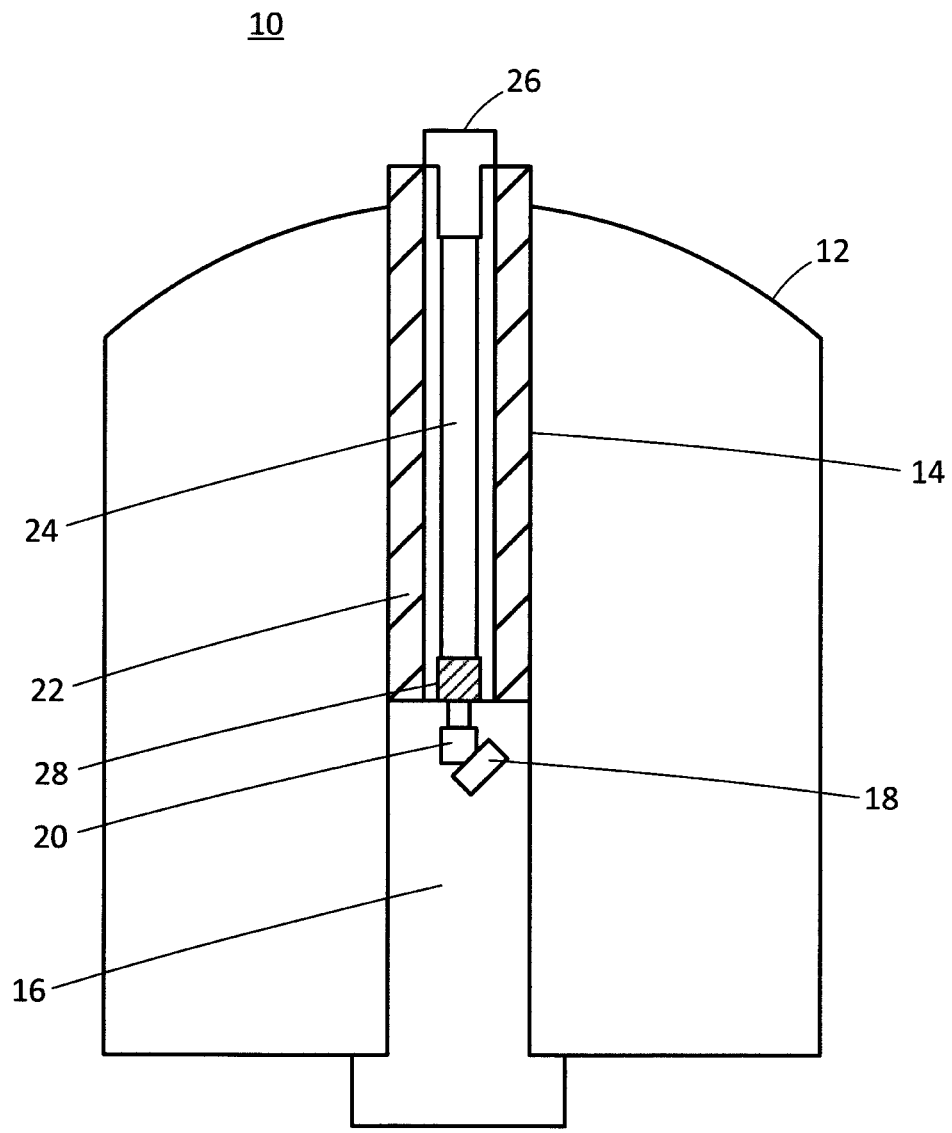
FIG. 1 illustrates an NMR apparatus according to an exemplary embodiment.

FIG. 1 illustrates an exemplary NMR apparatus according to an embodiment of the present disclosure. An NMR apparatus 10 can measure an NMR signal generated by a target nucleus in a sample.

A static magnetic field generator 12 can generate a static magnetic field. A bore 14 formed in a central region of the apparatus 12 is an elongated cavity extending in the vertical direction. An NMR probe device 16 has a cylinder shape extending, as a whole, in the vertical direction, so that it can be inserted in the bore 14 of the static magnetic field generator 12. The NMR probe device 16 according to the present embodiment is configured to implement the MAS method, and includes a sample tube support 18, a turning device 20, and a transmitting/receiving detection coil. The sample tube support 18 can support a sample tube in an inclined state to have the magic angle. The sample tube has, for example, a columnar shape so that a solid sample can be placed therein. In the sample tube support 18, a precise gas bearing supports the periphery of the sample tube on a rotation axis inclined at the magic angle with respect to the static magnetic field, so that the sample tube can rotate at high speeds during measurement. The turning device 20 can change the direction of a columnar axis of the sample tube introduced in the NMR probe device 16 into a direction parallel to the rotation axis of the sample tube support 18 and introduce the sample tube to the sample tube support 18.

A probe guide 22 is provided in the bore 14 so as to extend along the bore 14 from the top of the bore 14 to the NMR probe device 16. The probe guide 22 is, for example, a metal-made tubular member, which is capable of positioning the NMR probe device 16 in the axial direction in the static magnetic field generator 12.

A sample tube introducing and collecting apparatus, which is installed in the probe guide 22, can introduce a sample tube into the NMR probe device 16 and collect the sample tube from the NMR probe device 16. The sample tube introducing and collecting apparatus according to the present embodiment includes a passage member 24 serving as a passage for a sample tube (hereinafter, referred to as sample tube passage member 24), a carrier 26 for holding a sample tube (hereinafter, referred to as sample tube carrier 26), and an adapter 28 serving as a jetting member.

The sample tube passage member 24 is, for example, a metal-made tubular member, which extends from the top of the bore 14 to the NMR probe device 16 and is connected to and in communication with the NMR probe device 16. More specifically, the sample tube passage member 24 is connected to the turning device 20 in the NMR probe device 16 via the adapter 28. When introducing a sample tube, the sample tube can be introduced into the sample tube passage member 24 from an upper end of the sample tube passage member 24 and can be guided along the sample tube passage member 24 to the NMR probe device 16. In the NMR probe device 16, the sample tube is introduced from the sample tube passage member 24 to the turning device 20 and the turning device 20 changes the direction of the sample tube. The direction changed sample tube is then introduced from the turning device 20 to the sample tube support 18. In collecting the sample tube, the sample tube passes through the sample tube passage member 24 and exits from the NMR probe device 16 to the outside.

In the present embodiment, the sample tube carrier 26 that can accommodate a sample tube is used to introduce and collect the sample tube into and from the NMR probe device 16. The sample tube carrier 26 is a member attachable to and detachable from one end (upper end) of the sample tube passage member 24. When introducing a sample tube, the sample tube carrier 26 in which a sample tube is housed is mounted on the upper end of the sample tube passage member 24, the sample tube can be introduced from the sample tube carrier 26 into the sample tube passage member 24, and then the sample tube can be guided to the NMR probe device 16 through the sample tube passage member 24. In collecting a sample tube, the sample tube is conveyed from the NMR probe device 16 to the upper end of the sample tube passage member 24 and the sample tube is discharged into the sample tube carrier 26 provided at the upper end. Supplying gas into the sample tube passage member 24 enables the above-mentioned discharging of the sample tube. The sample tube carrier 26 is made of, for example, a resin, such as Teflon (registered trademark).

The adapter 28 is installed at the other end (lower end) of the sample tube passage member 24, and is functionally operable as a gas distribution device by which the gas supplied from a high-pressure gas supplying apparatus (not illustrated) can be jetted into the sample tube passage member 24. In collecting a sample tube, the supplied gas impels the sample tube from the sample tube support 18 to the sample tube carrier 26.

Hereinafter, the sample tube introducing and collecting apparatus according to the present embodiment will be described in detail below.

Figure 2:
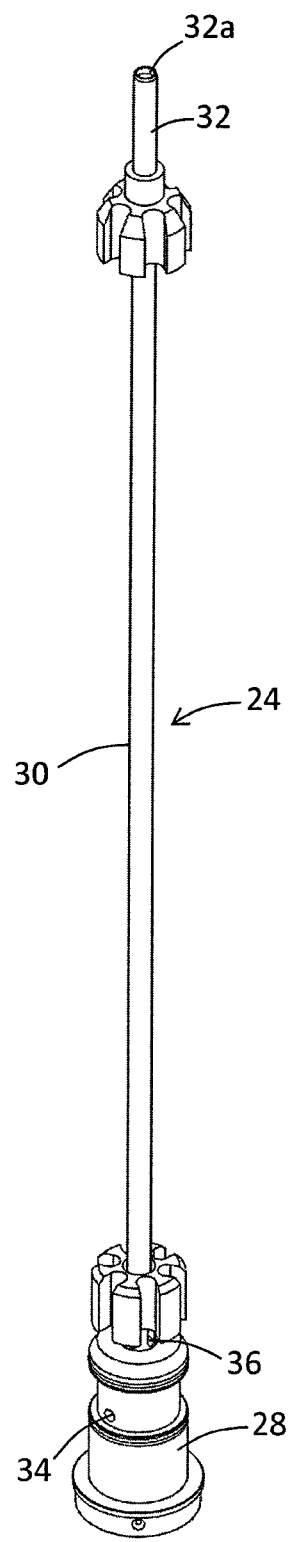
FIG. 2 is a perspective view illustrating the entire configuration of a sample tube passage member.

First, the appearance of the sample tube passage member 24 will be described in detail below with reference to FIG. 2. FIG. 2 is a perspective view illustrating the entire configuration of the sample tube passage member 24. The sample tube passage member 24 includes a tubular passage member 30 extending in the vertical direction and a tubular insertion member 32 provided at one end of the passage member 30. As described in detail below, when introducing a sample tube and collecting the sample tube, the insertion member 32 is inserted into the sample tube carrier 26. The adapter 28 is provided at the other end of the passage member 30.

Figure 3:
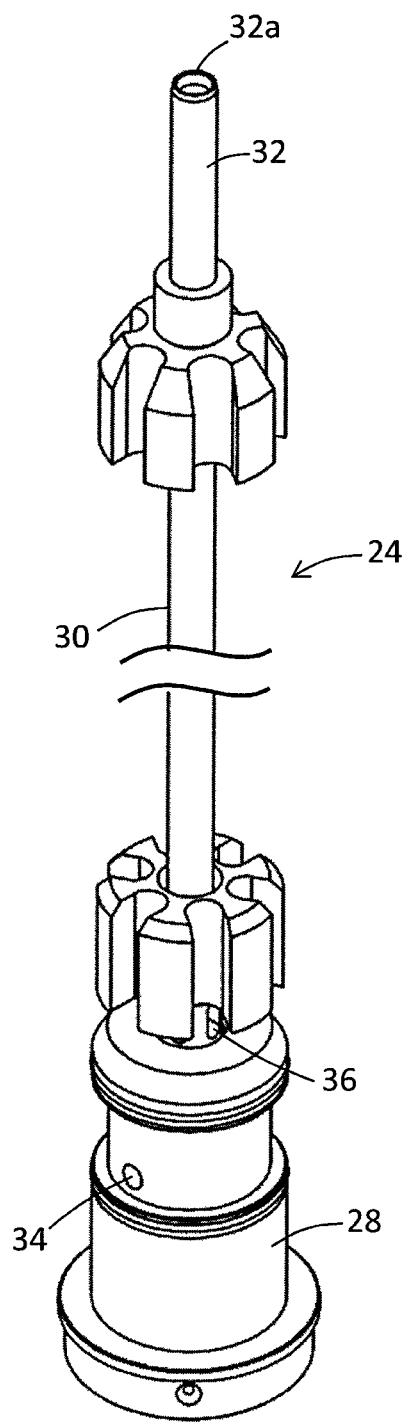
FIG. 3 is a perspective view illustrating a part of the sample tube passage member.
Figure 4:
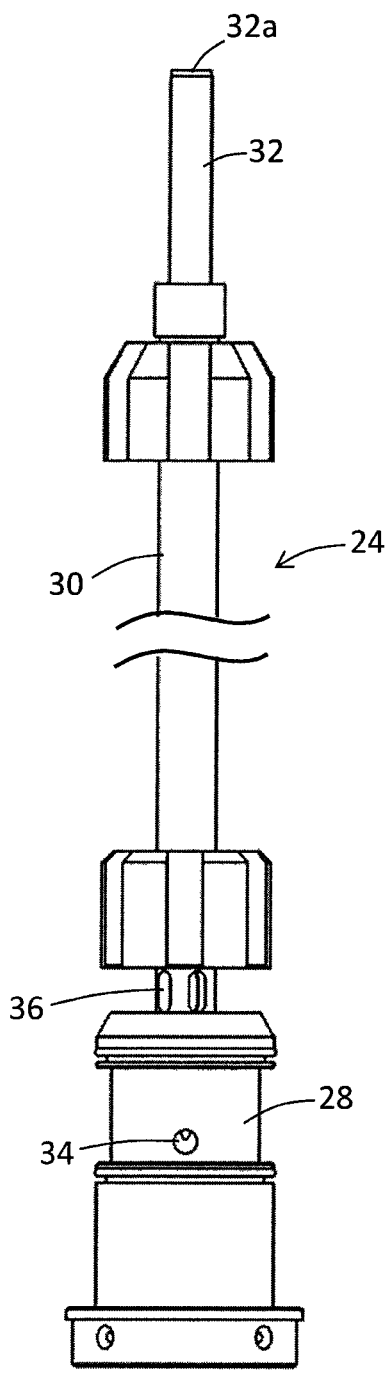
FIG. 4 is a view illustrating the part of the sample tube passage member, viewed from a side thereof.

A part of the sample tube passage member 24 and the adapter 28 are illustrated in FIGS. 3 and 4. FIG. 3 is a perspective view illustrating the insertion member 32 and the adapter 28. FIG. 4 is a view illustrating the insertion member 32 and the adapter 28 viewed from a side thereof. A gas introduction hole 34, serving as a passage leading from the outside to the inside of the adapter 28, is formed on a side surface of the adapter 28. The high-pressure gas supplying apparatus (not illustrated) can supply gas into the adapter 28 via the gas introduction hole 34. At least one hole 36 for releasing the gas from the inside to the outside is formed at an appropriate position (e.g., an upper surface) of the adapter 28, and the hole 36 is located adjacent to the passage member 30 in relation to the gas introduction hole 34. The hole 36 will be described in detail below.

Figure 5:
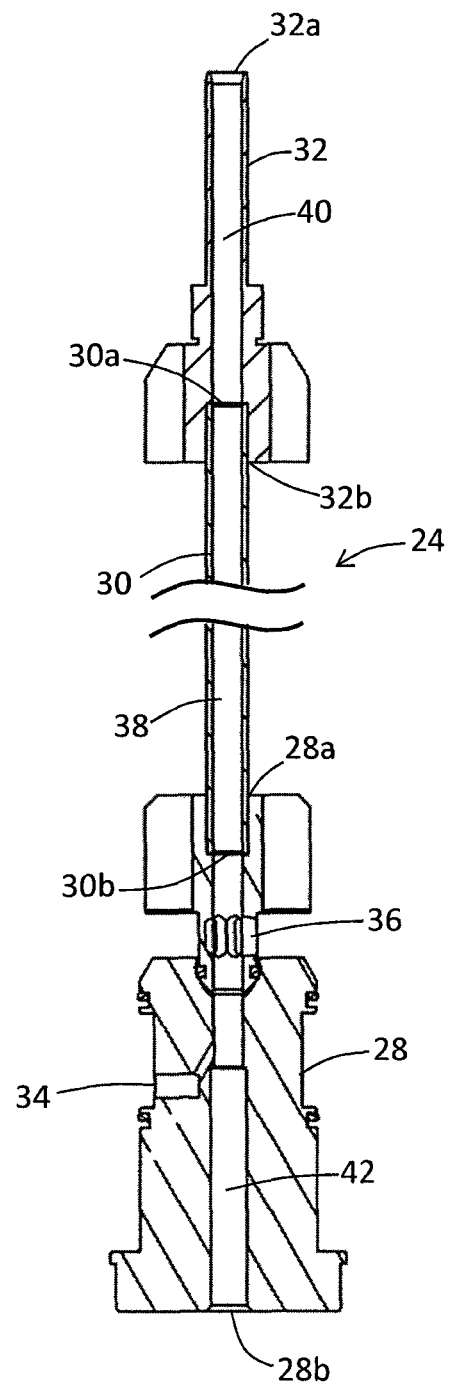
FIG. 5 is a cross-sectional view illustrating the sample tube passage member and an adapter.

Next, the internal structure of each of the sample tube passage member 24 and the adapter 28 will be described in detail below with reference to FIG. 5. FIG. 5 is a cross-sectional view illustrating a part of the sample tube passage member 24 and the adapter 28.

The passage member 30 has an upper end 30a opening at one end and a lower end 30b opening at the other end. In addition, the passage member 30 has a passage 38 extending along the passage member 30 from the upper end 30a to the lower end 30b so that a sample tube can move in the passage 38.

The insertion member 32 has an upper end 32a opening at one end and a lower end 32b opening at the other end. In addition, the insertion member 32 has a passage 40 extending along the insertion member 32 from the upper end 32a to the lower end 32b so that a sample tube can move in the passage 40. When introducing a sample tube, the sample tube can be introduced from the upper end 32a into the passage 40 of the insertion member 32. When collecting a sample tube, the sample tube can be discharged from the upper end 32a to the outside (into the sample tube carrier 26 as described in detail below). The upper end 30a of the passage member 30 can be inserted into the lower end 32b of the insertion member 32 toward the passage 40, so that the passage 38 in the passage member 30 can communicate with the passage 40 in the insertion member 32.

The adapter 28 has an upper end 28a opening at one end and a lower end 28b opening at the other end. In addition, the adapter 28 has a passage 42 extending from the upper end 28a to the lower end 28b so that a sample tube can move in the passage 42. Further, the adapter 28 includes at least one hole 36 formed on its side surface between the gas introduction hole 34 and the upper end 28a of the adapter 28. Each hole 36 is in communication with the passage 42 in the adapter 28. The hole 36 enables a part of gas supplied into the passage 42 to exit to the outside of the adapter 28.

The lower end 30b of the passage member 30 can be inserted into the upper end 28a of the adapter 28 toward the passage 42, so that the passage 38 in the passage member 30 can communicate with the passage 42 in the adapter 28. Meanwhile, the lower end 28b of the adapter 28 is connected to the turning device 20 in the NMR probe device 16.

Connecting the passage member 30 with the insertion member 32 and the adapter 28 can provide interconnection between the passage 38 in the passage member 30, the passage 40 in the insertion member 32, and the passage 42 in the adapter 28. Each sample tube moves in these passages when the sample tube is introduced into the NMR probe device 16 and when the sample tube is collected from the NMR probe device 16. More specifically, when introducing a sample tube, the gravity acting on the sample tube plays a role of conveying the sample tube from the upper end 32a of the insertion member 32 into the passage 40 in the insertion member 32. In this case, the sample tube moves from the passage 40 of the insertion member 32 into the passage 38 of the passage member 30, and further moves into the passage 42 of the adapter 28, and reaches the lower end 28b of the adapter 28 and is finally introduced into the NMR probe device 16. When collecting a sample tube, the gas pressure acting on the sample tube plays a role of discharging the sample tube from the NMR probe device 16 to the passage 42 of the adapter 28 via the lower end 28b of the adapter 28. In this case, the sample tube moves from the passage 42 of the adapter 28 to the passage 38 of the passage member 30, and further moves into the passage 40 of the insertion member 32, and reaches the upper end 32a of the insertion member 32 and is finally discharged to the outside (into the sample tube carrier 26 as described in detail below).

The gas introduction hole 34 formed on the side surface of the adapter 28 is in communication with the passage 42 in the adapter 28. The gas introduction hole 34 enables the gas supplied from the high-pressure gas supplying apparatus to flow into the passage 42 of the adapter 28. The gas is subsequently supplied into the passage 38 of the passage member 30 and the passage 40 of the insertion member 32.

Figure 6:
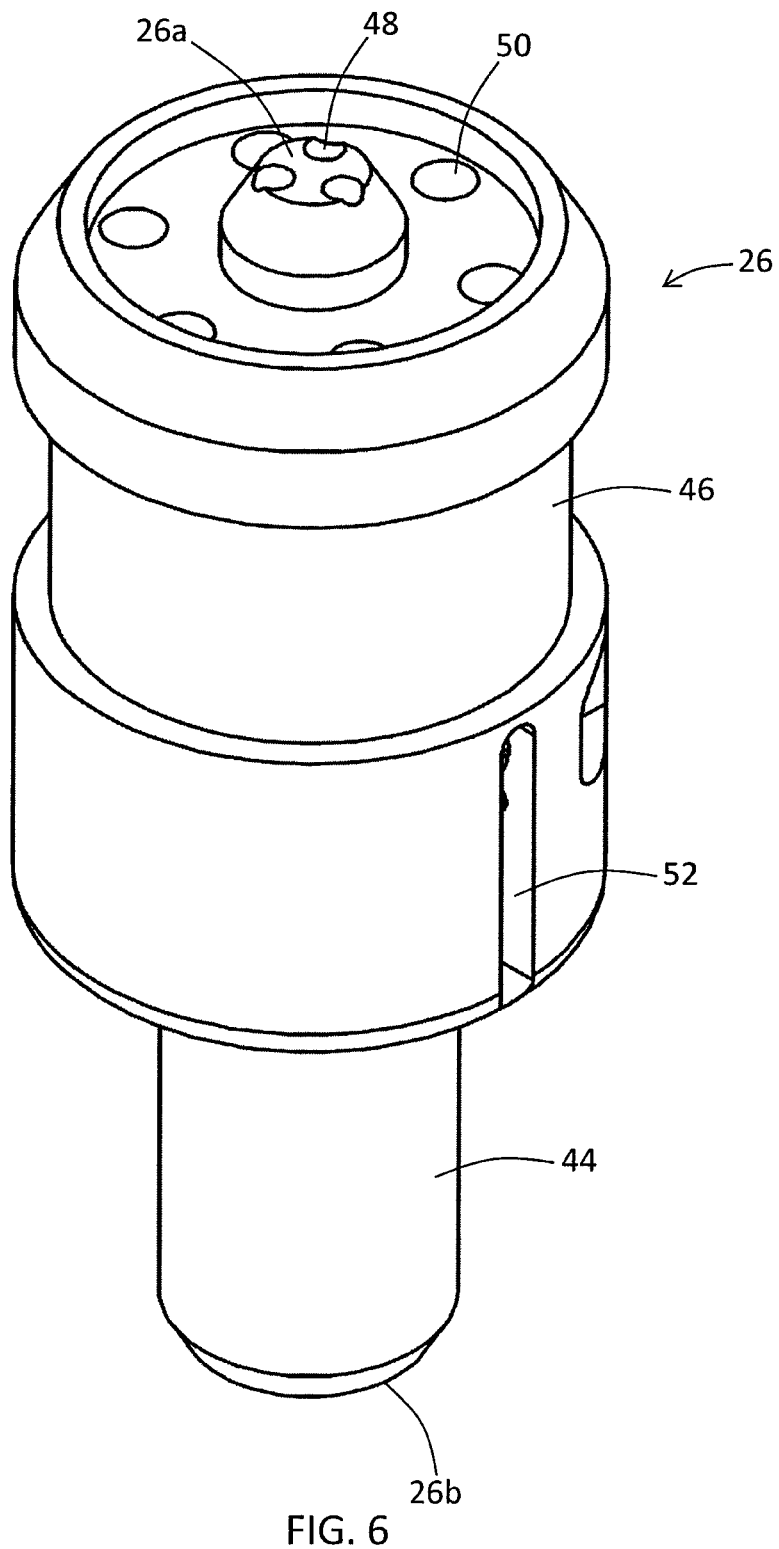
FIG. 6 is a perspective view illustrating a sample tube carrier.
Figure 7:
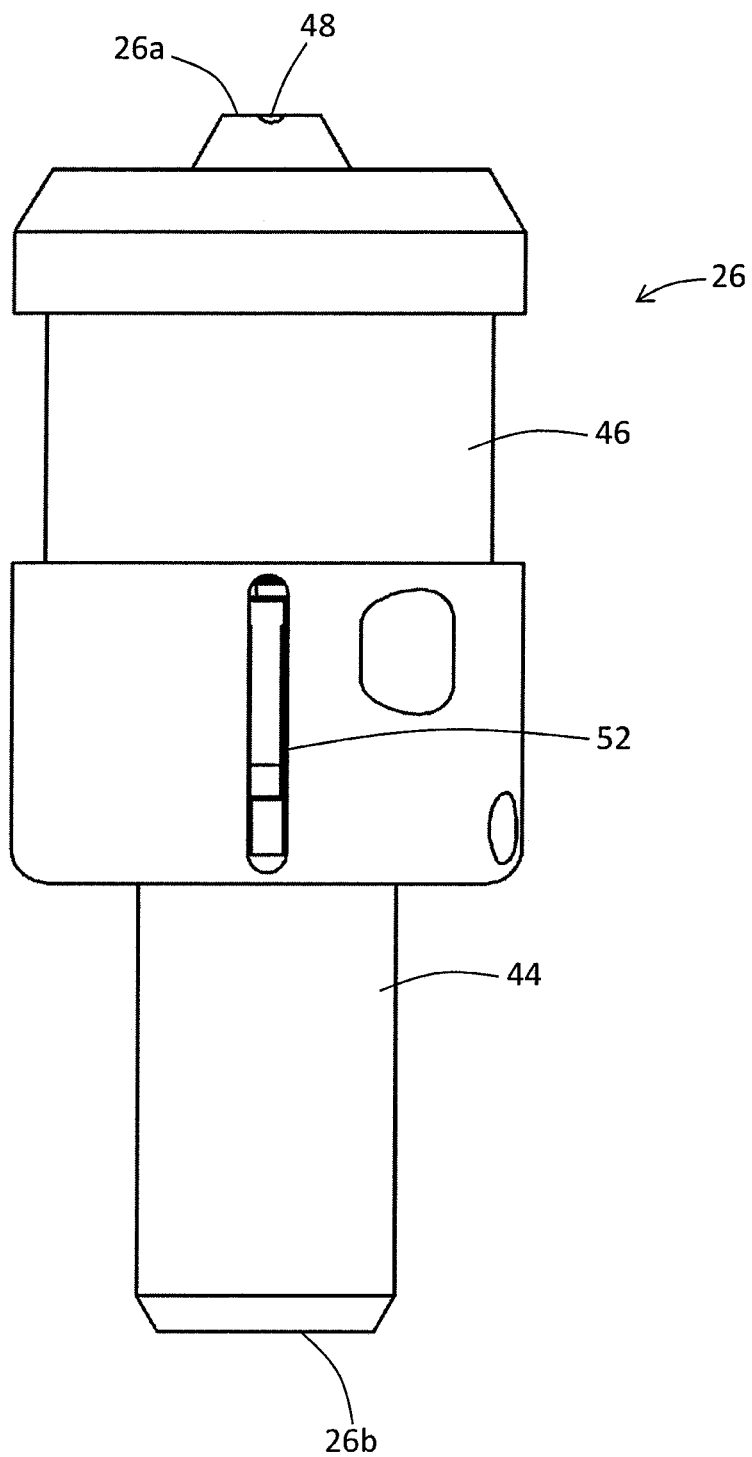
FIG. 7 is a view illustrating the sample tube carrier, viewed from a side thereof.
Figure 8:
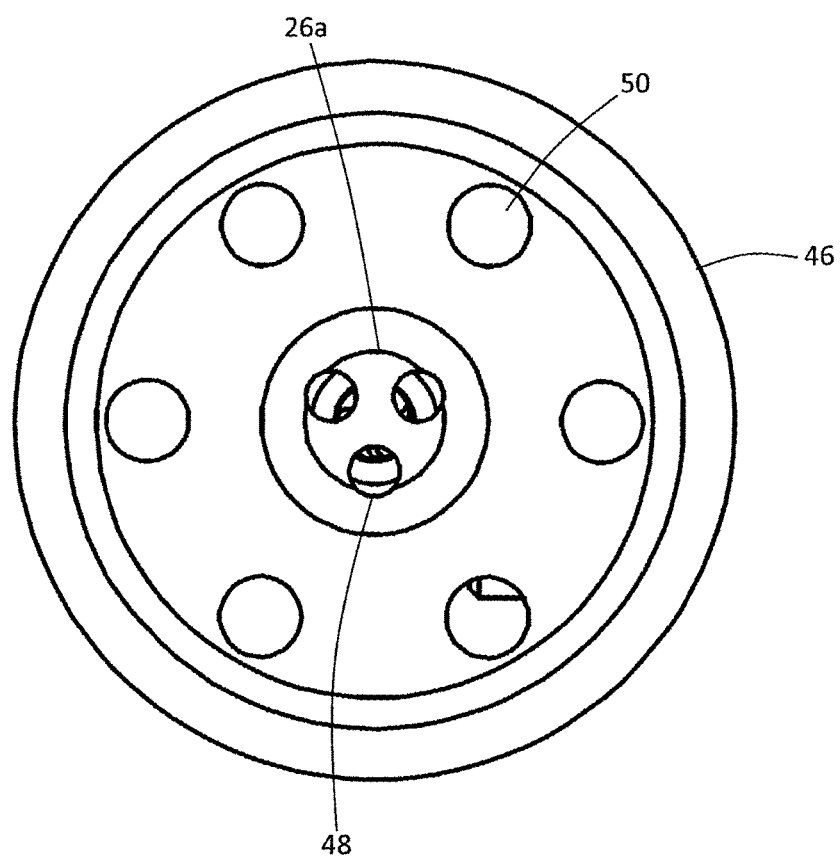
FIG. 8 is a view illustrating the sample tube carrier, viewed from the top.
Figure 9:
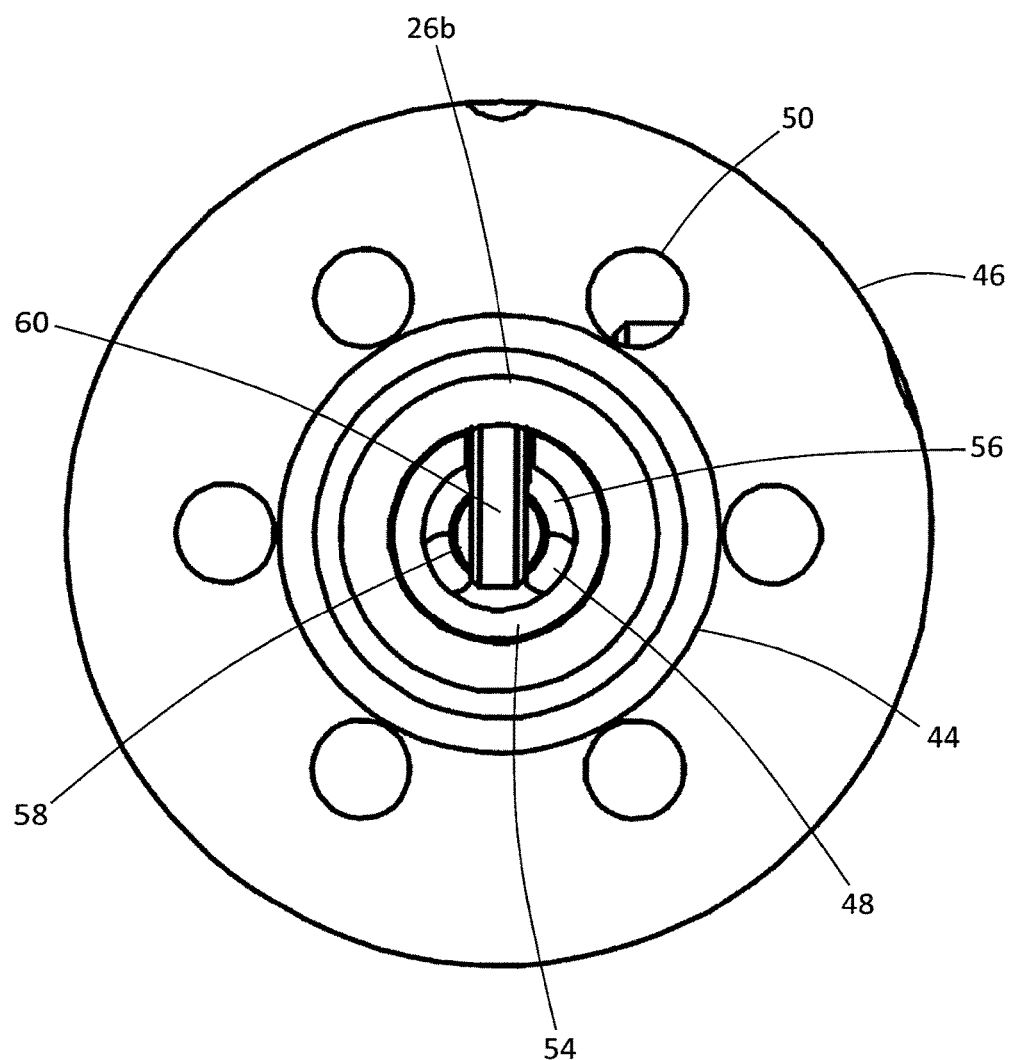
FIG. 9 is a view illustrating the sample tube carrier, viewed from the bottom.

Hereinafter, the appearance of the sample tube carrier 26 will be described in detail below with reference to FIGS. 6 to 9. FIG. 6 is a perspective view illustrating the entire configuration of the sample tube carrier 26. FIG. 7 is a view illustrating the sample tube carrier 26, viewed from a side thereof. FIG. 8 is a view illustrating the sample tube carrier 26, viewed from the top. FIG. 9 is a view illustrating the sample tube carrier 26, viewed from the bottom.

As illustrated in FIGS. 6 and 7, the sample tube carrier 26 includes a lower carrier 44 having a tubular shape and an upper carrier 46 having a tubular shape and provided on the lower carrier 44. The upper carrier 46 has an outer periphery greater than an outer periphery of the lower carrier 44. The lower carrier 44 and the upper carrier 46 are, for example, an integrated member.

As described in detail below, the upper carrier 46 has a housing space for accommodating a sample tube. As illustrated in FIGS. 6 and 8, the sample tube carrier 26 has an upper end 26a (upper end of the upper carrier 46) as one end at which at least one opening 48 being in communication with the housing space is formed.

As illustrated in FIGS. 6, 8, and 9, the upper carrier 46 has at least one through hole 50 in an outer region surrounding the opening 48. Each through hole 50 extends through the upper carrier 46 in a direction along which the lower carrier 44 and the upper carrier 46 are aligned. The through hole 50 will be described in detail below.

In addition, the upper carrier 46 has a locking mechanism housing space 52 that is in communication with the housing space. As described in detail below, a locking mechanism is disposed in the locking mechanism housing space 52.

Figure 10:
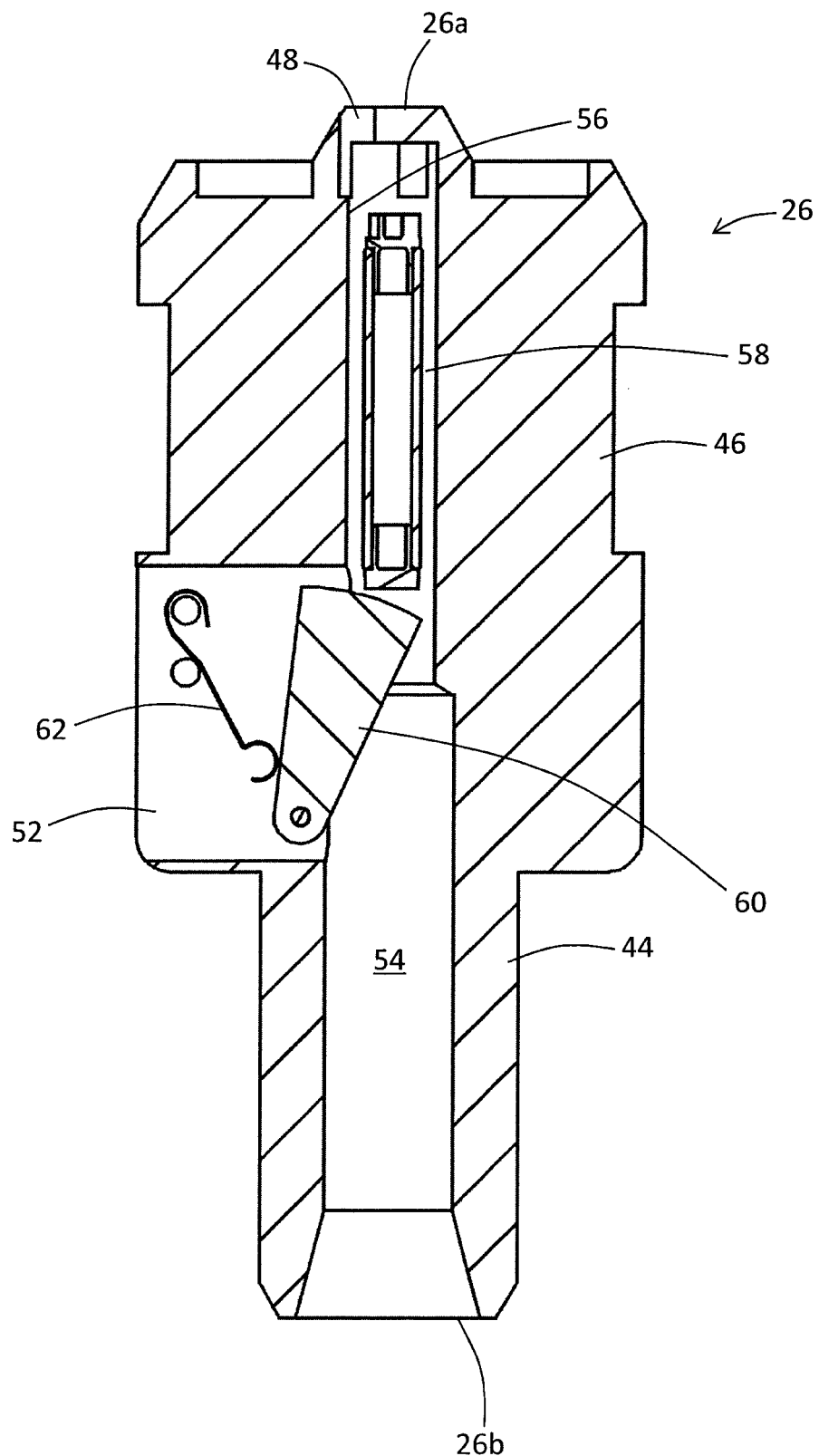
FIG. 10 is a cross-sectional view illustrating the sample tube carrier.
Figure 11:
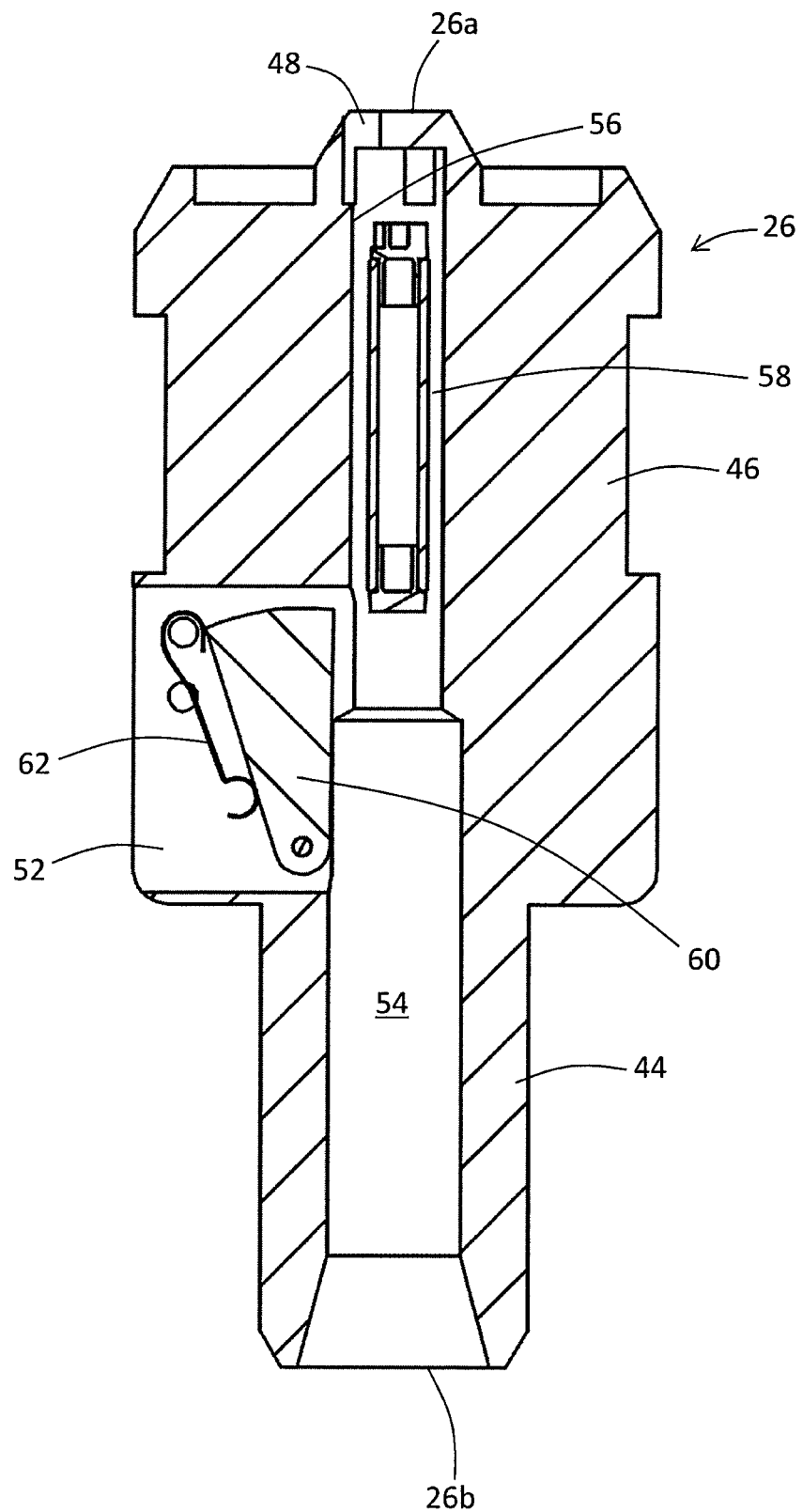
FIG. 11 is a cross-sectional view illustrating the sample tube carrier.

Next, the internal structure of the sample tube carrier 26 will be described in detail below with reference to FIGS. 10 and 11. FIGS. 10 and 11 are cross-sectional views illustrating the sample tube carrier 26. FIG. 10 illustrates the sample tube carrier 26 in a locked state of the locking mechanism, and FIG. 11 illustrates the sample tube carrier 26 in an unlocked state of the locking mechanism.

As illustrated in FIG. 10, the sample tube carrier 26 has a lower end 26b (a lower end of the lower carrier 44) as the other end in an opened state. The sample tube carrier 26 has a passage 54 and a housing space 56 sequentially formed as an internal space extending from the lower end 26b to the upper end 26a. The passage 54 is in communication with the housing space 56. A sample tube 58 is placed in the housing space 56, and a solid sample is housed in the sample tube 58. As described above, the opening 48 is formed at the upper end 26a, and the opening 48 is in communication with the housing space 56. The size of the opening 48 is smaller than that of the sample tube 58. More specifically, the width of the opening 48 is smaller compared to the length and the width of the sample tube 58 (the length and the diameter of a columnar body of the sample tube 58), so that the sample tube 58 cannot pass through the opening 48.

In addition, the locking mechanism housing space 52 opening on the side surface of the upper carrier 46 is in communication with an upper part of the passage 54 and a lower part of the housing space 56. An opening/closing valve 60 and a spring 62 (e.g., plate spring) serving as an elastic member are disposed as parts cooperatively constituting the locking mechanism in the locking mechanism housing space 52. The spring 62 has one end anchored in the locking mechanism housing space 52 and the other end contacting with a side surface of the valve 60. Therefore, the spring 62 can provide an urging force to the valve 60 in a direction from the locking mechanism housing space 52 toward the passage 54 and the housing space 56. When the urging force of the spring 62 is imparted on the valve 60, the valve 60 is pushed toward the boundary between the upper part of the passage 54 and the lower part of the housing space 56 and held in a protruded state as illustrated in FIG. 10. Thus, the passage 54 and the housing space 56 are disconnected from each other. This state is referred to as closed state of the valve 60 (locked state of the locking mechanism). When the valve 60 is closed in a state where the sample tube is in the housing space 56, the sample tube remains in the housing space 56.

On the other hand, if a force exceeding the urging force of the spring 62 is applied to the valve 60 in a direction opposed to the direction of the urging force, the valve 60 retracts from the passage 54 and the housing space 56 into the locking mechanism housing space 52 as illustrated in FIG. 11. In other words, the passage 54 and the housing space 56 are brought into a connected state. This state is referred to as opened state of the valve 60 (unlocked state of the locking mechanism). When the valve 60 is in the opened state, the sample tube 58 in the housing space 56 can move from the housing space 56 to the passage 54, mainly due to gravity.

As described in detail below, when introducing a sample tube, the sample tube carrier 26 is mounted on an upper part of the sample tube passage member 24 (the insertion member 32) and the insertion member 32 of the sample tube passage member 24 is inserted into the passage 54 of the sample tube carrier 26 from the opening formed at the lower end 26b. Then, the insertion member 32 comes into contact with the closed valve 60 (the valve 60 pushed toward the passage 54 by the urging force of the spring 62 and held in the protruded state) and presses the valve 60 upward, and accordingly the valve 60 retracts into the locking mechanism housing space 52 according to the movement of the valve 60. As a result, the sample tube 58 moves from the housing space 56 into the sample tube passage member 24 through the passage 54. When collecting a sample tube, the sample tube carrier 26 is mounted on the upper part of the sample tube passage member 24 (the insertion member 32) and the valve 60 retracts into the locking mechanism housing space 52. In this state, the gas pressure is applied and the sample tube is discharged from the NMR probe device 16 to the housing space 56 in the sample tube carrier 26.

Figure 12:
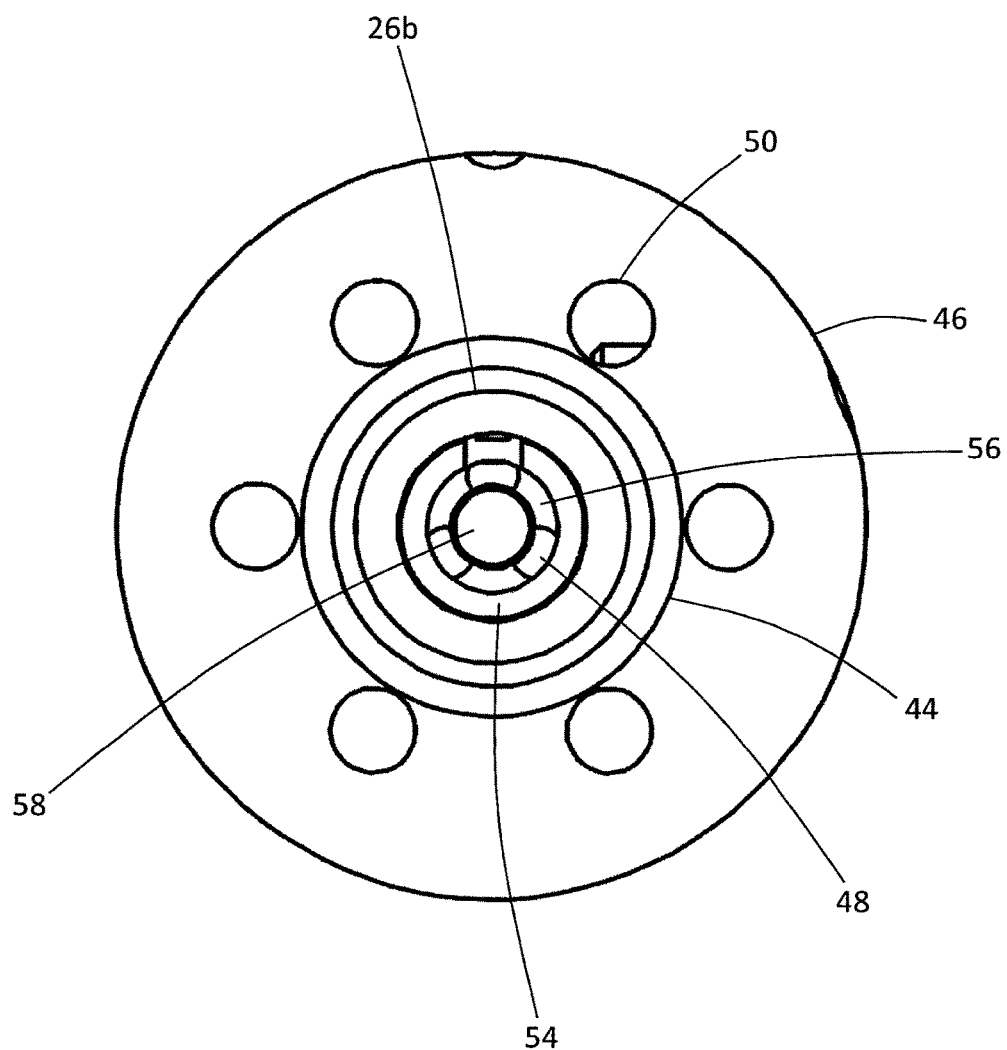
FIG. 12 is a view illustrating the sample tube carrier, viewed from the bottom.

FIG. 12 illustrates the sample tube carrier 26 in the unlocked state of the locking mechanism, viewed from the bottom. As the valve 60 is kept retracted in the locking mechanism housing space 52, the passage 54 and the housing space 56 are in communication with each other.

Figure 13:
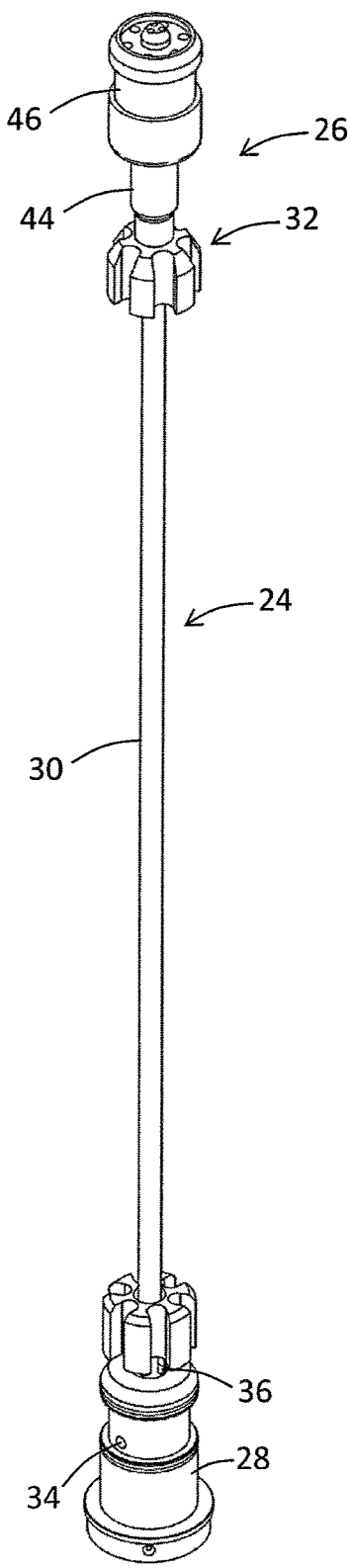
FIG. 13 is a perspective view illustrating the sample tube carrier and the sample tube passage member.
Figure 14:
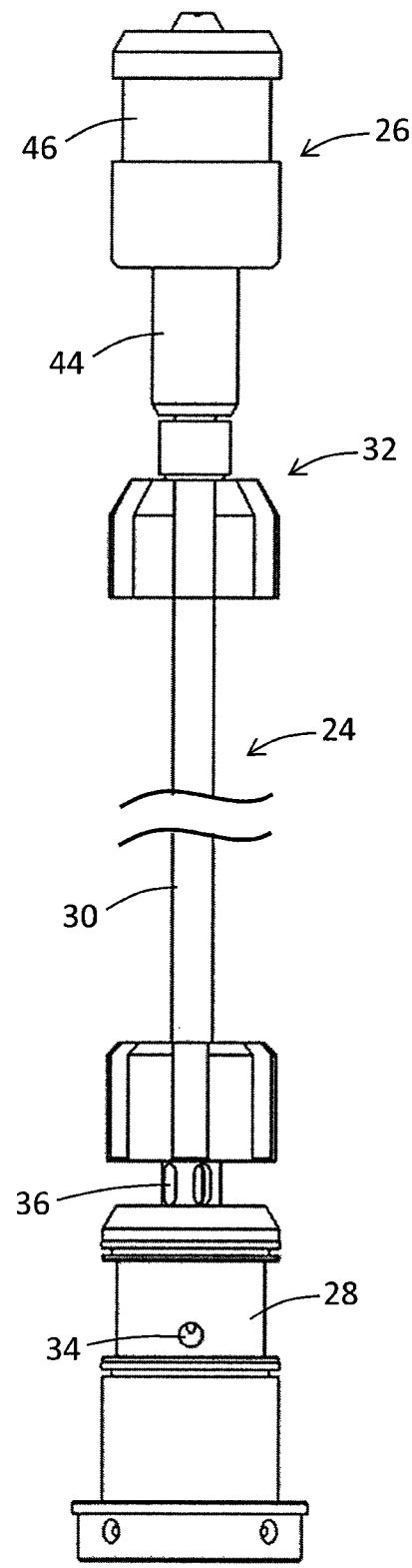
FIG. 14 is a view illustrating the sample tube carrier and the sample tube passage member, viewed from a side thereof.
Figure 15:
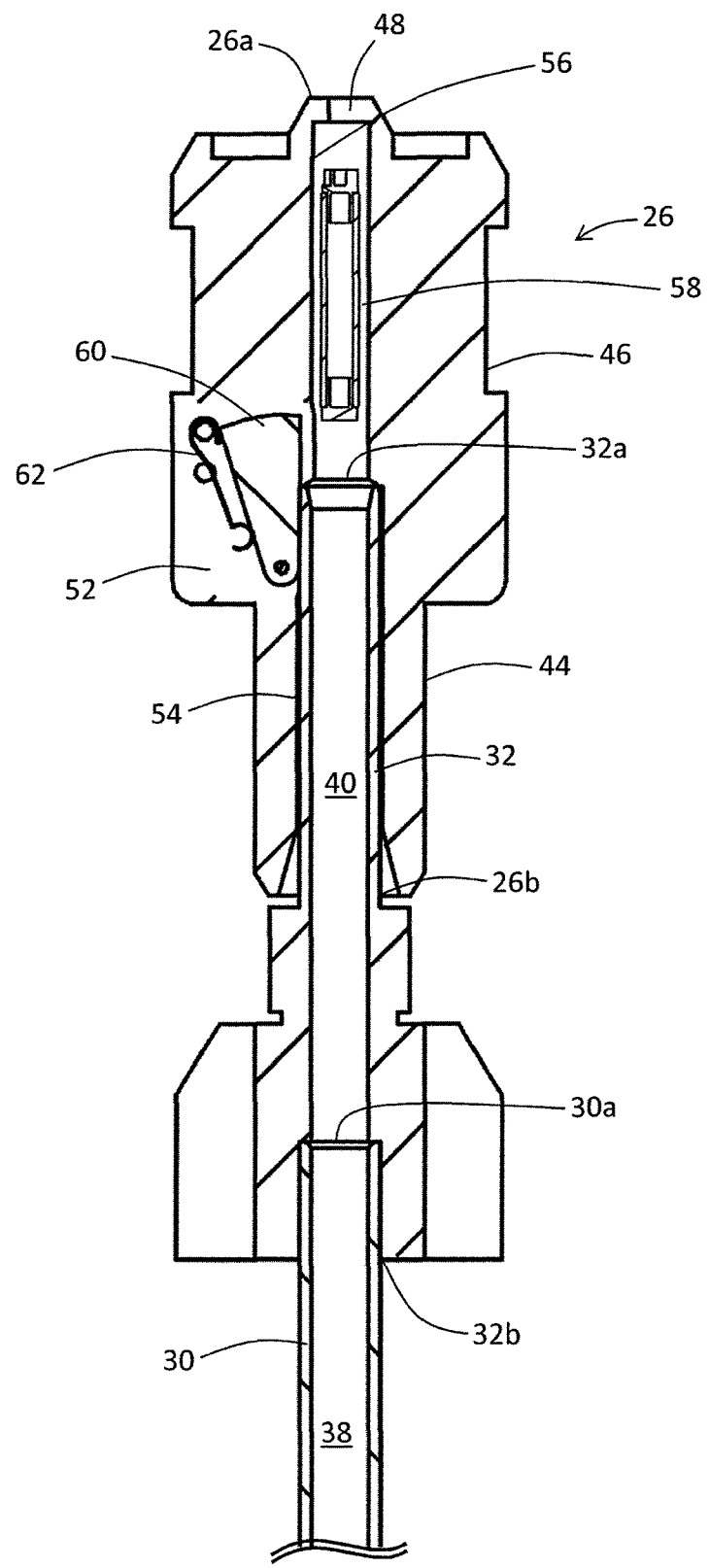
FIG. 15 is a cross-sectional view illustrating the sample tube carrier and the sample tube passage member.

When introducing and/or collecting a sample tube, the sample tube carrier 26 is attached to the sample tube passage member 24. This will be described in detail below with reference to FIGS. 13 to 15. FIG. 13 is a perspective view illustrating the sample tube carrier 26 and the sample tube passage member 24. FIG. 14 is a view illustrating the sample tube carrier 26 and the sample tube passage member 24 viewed from a side thereof. FIG. 15 is a cross-sectional view illustrating the sample tube carrier 26 and the sample tube passage member 24. In FIGS. 14 and 15, a part of the passage member 30 is omitted.

As illustrated in FIGS. 13 and 14, the sample tube carrier 26 is mounted on the upper part of the sample tube passage member 24 (the insertion member 32). FIG. 15 illustrates the arrangement at this moment. The insertion member 32 of the sample tube passage member 24 is inserted in the passage 54 of the sample tube carrier 26 through the opening formed at the lower end 26b of the sample tube carrier 26. The insertion member 32 is inserted until it reaches the boundary between the passage 54 and the housing space 56. Inserting the insertion member 32 into the passage 54 causes the upper end 32a of the insertion member 32 to come into contact with the closed valve 60 (see FIG. 10) and push the valve 60 upward. When the leading end of the insertion member 32 reaches the boundary between the passage 54 and the housing space 56, the valve 60 retracts into the locking mechanism housing space 52 as a result of completion of the pushing-up motion. More specifically, the valve 60 is opened and the locking mechanism is unlocked. Accordingly, the housing space 56 is kept in communication with the passage 40 in the insertion member 32 through the upper end 32a of the insertion member 32.

In introducing a sample tube when the locking mechanism is in the unlocked state, the sample tube 58 moves from the housing space 56 toward the insertion member 32 due mainly to gravity and moves into the passage 40 in the insertion member 32 through the upper end 32a (opening) of the insertion member 32. The sample tube 58 further moves from the passage 40 of the insertion member 32 into the passage 38 in the passage member 30 and subsequently into the passage 42 in the adapter 28, thereby reaching the lower end 28b of the adapter 28. Thus, the sample tube 58 is finally introduced into the NMR probe device 16.

In collecting a sample tube when the locking mechanism is in the unlocked state, the gas pressure forces the sample tube 58 to move from the NMR probe device 16 into the passage 42 in the adapter 28. The sample tube 58 is subsequently moved upward through the passage 38 in the passage member 30 and the passage 40 in the insertion member 32 to reach the upper end 32a of the insertion member 32. Thus, the sample tube 58 is discharged into the housing space 56 in the sample tube carrier 26. In this manner, the sample tube 58 can be taken out from the NMR probe device 16 into the sample tube carrier 26.

Figure 16:
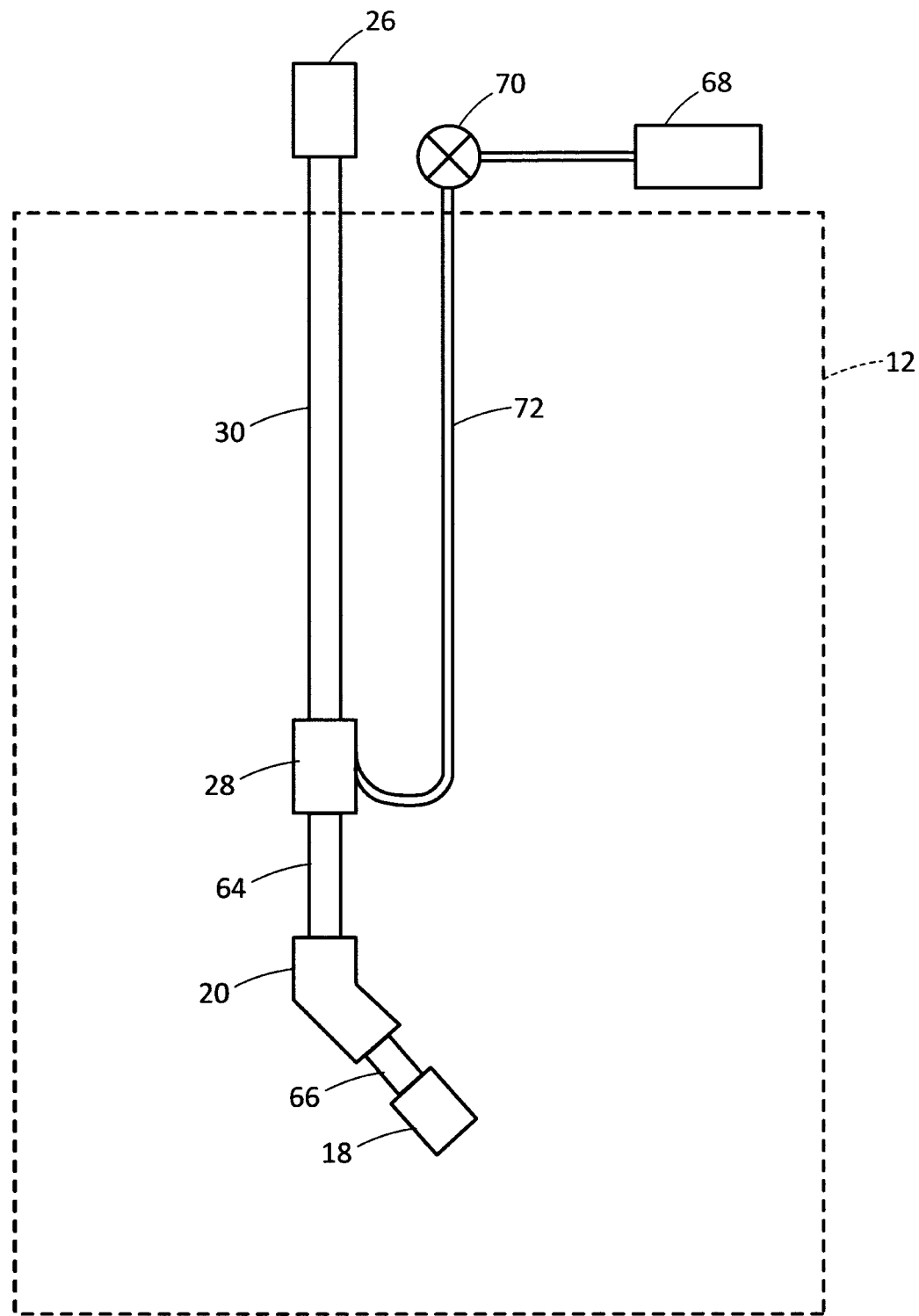
FIG. 16 illustrates a gas supply mechanism.

Hereinafter, an exemplary operation using the gas pressure to discharge the sample tube 58 will be described in detail below with reference to FIG. 16. FIG. 16 illustrates a gas supply mechanism.

A passage member 64 connects the adapter 28 provided at the lower end of the sample tube passage member 24 with the turning device 20. A passage member 66 connects the turning device 20 with the sample tube support 18. The sample tube can move between the sample tube carrier 26 and the sample tube support 18, by sequentially passing through the sample tube passage member 24 and the passage members 64 and 66.

The sample tube support 18 is configured to rotate a sample tube at high speeds in a state where the sample tube is supported on the rotation axis inclined at the magic angle with respect to the static magnetic field.

A high-pressure gas supplying apparatus 68, a valve 70, a gas piping 72, and the like can be arranged to supply high-pressure gas to the adapter 28. The high-pressure gas supplying apparatus 68 is, for example, constituted by a gas cylinder, a gas tank, a compressor, a pressure-reducing valve, a flow regulating valve, and the like. As described above, the high-pressure gas can be supplied via the gas introduction hole 34 into the passage 42 in the adapter 28.

Jetting high-pressure gas into the adapter 28 can generate, due to its inertia, a gas stream flowing in a direction toward the sample tube carrier 26, in the sample tube passage member 24. In addition, the gas jetted at high speeds generates negative pressure locally due to the Bernoulli effect and attracts surrounding gas. More specifically, the adapter 28 is functionally operable as a pump that sucks gas from an upstream side and jets the gas to a downstream side. This pump function generates negative pressure at the upstream side.

Adjusting the attachment angle of the gas piping 72 to the sample tube passage member 24 can adjust the ratio of the suction force to the jetting force. In addition, adjusting the ratio of the internal diameter of the sample tube passage member 24 to the internal diameter of the gas piping 72 can adjust the ratio of the suction force to the jetting force.

The high-pressure gas is, for example, air, nitrogen, helium, or the like. Any specific gas selected for the measurement may be usable.

The gas piping 72 is endurable against the pressure of, for example, 0 to 0.5 MPa and may be constituted by a pressure-resistant urethane pipe or the like.

In the sample tube collecting operation, the high-pressure gas supplied from the high-pressure gas supplying apparatus 68 to the adapter 28 can generate, in the sample tube passage member 24, a gas stream in the direction toward the sample tube carrier 26. At this moment, a negative pressure is generated at an upstream side of the gas stream (i.e., at the sample tube support 18 and the turning device 20). The negative pressure acts to suck the sample tube disposed in the sample tube support 18 into the adapter 28 from the sample tube support 18 via the turning device 20. Then, the sample tube is discharged from the adapter 28 into the sample tube carrier 26 via the sample tube passage member 24.

In the sample tube introducing operation, in a state where the high-pressure gas supplying apparatus 68 does not supply high-pressure gas, the sample tube housed in the sample tube carrier 26 moves from the sample tube carrier 26 to the sample tube support 18, mainly due to gravity. To prevent the sample tube from dropping suddenly, it may be useful to generate, in the sample tube passage member 24, a gas stream in the direction toward the sample tube carrier 26 and lower the gas pressure gradually while the sample tube is moving. Alternatively, it may be useful to generate a gas stream in a direction from the sample tube carrier 26 toward the sample tube support 18 so that the sample tube can move actively without depending on gravity.

Hereinafter, an exemplary operation of the sample tube introducing and collecting apparatus according to the present embodiment will be described in detail below.

The sample tube introducing operation, as illustrated in FIGS. 13 to 15, includes mounting the sample tube carrier 26 on the upper part of the sample tube passage member 24 and causing the insertion member 32 to push the valve 60 in the sample tube carrier 26 to bring it into the opened state (unlocked state). The sample tube 58 housed in the housing space 56 of the sample tube carrier 26 is introduced to the sample tube support 18 in the NMR probe device 16 mainly due to gravity via the sample tube passage member 24 and the adapter 28.

Similar to the sample tube introducing operation, the sample tube collecting operation includes mounting the sample tube carrier 26 on the upper part of the sample tube passage member 24 to bring the valve 60 into the opened state (the unlocked state). In this state, the high-pressure gas supplying apparatus 68 supplies high-pressure gas to the adapter 28 to generate, in the adapter 28 and the sample tube passage member 24, a gas stream in the direction toward the sample tube carrier 26, thereby generating negative pressure on the upstream side of the gas stream. In the present embodiment, as illustrated in FIG. 5, the high-pressure gas is supplied into the adapter 28 from the gas introduction hole 34 formed on the side surface of the adapter 28 and the negative pressure is generated on the upstream side of the gas stream (i.e., at the lower end 28b of the adapter 28). The generated negative pressure acts to suck the sample tube 58 from the sample tube support 18 into the adapter 28. In addition, the gas stream toward the sample tube carrier 26 discharges the sample tube 58 from the adapter 28 into the housing space 56 in the sample tube carrier 26 through the sample tube passage member 24 (see FIG. 15).

However, generating appropriate negative pressure for sucking the sample tube 58 from the sample tube support 18 to the adapter 28 may be difficult in the case of an inadequate relationship between the flow rate of the gas supplied into the adapter 28 and the gas pressure thereof. For example, when the flow rate of the gas is excessively high, the generated negative pressure may be insufficient to suck up the sample tube 58 to the adapter 28. To solve such drawback, at least one hole 36 is formed on a side surface of the adapter 28, between the gas introduction hole 34 and the upper end 28a of the adapter 28; more specifically, on the downstream side of the gas stream (see FIG. 5). The hole 36 enables a part of the gas supplied into the passage 42 of the adapter 28 to exit to the outside of the adapter 28. Therefore, the flow rate of the gas can be appropriately adjusted so that appropriate negative pressure can be applied to the sample tube 58 when it is sucked up from the sample tube support 18 to the adapter 28.

Figure 17:
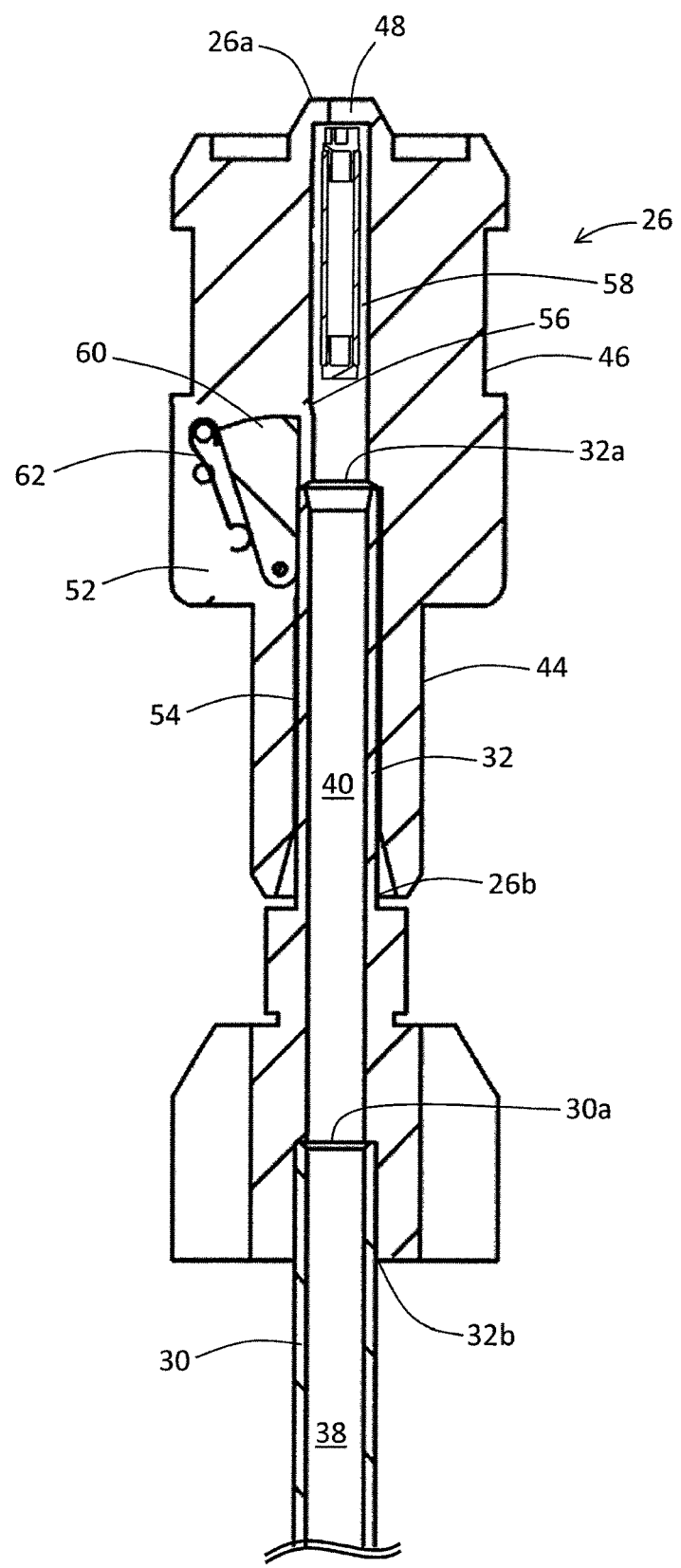
FIG. 17 is a cross-sectional view illustrating the sample tube carrier and the sample tube passage member.

In the sample tube collecting operation, when the sample tube 58 is discharged into the housing space 56, the supplied gas moves the sample tube 58 upward (toward the upper end 26a) in the housing space 56. FIG. 17 illustrates the state of the sample tube 58 at this moment. FIG. 17 is a cross-sectional view illustrating the sample tube carrier 26 and a part of the sample tube passage member 24. The sample tube 58 is lifted upward in the housing space 56 by the gas pressure and comes into contact with an inner surface of the upper end 26a of the sample tube carrier 26. As a result, the sample tube 58 partially or completely closes the opening 48 formed at the upper end 26a. When the sample tube 58 closes the opening 48, there is no path for escape of the gas supplied into the housing space 56 through the sample tube passage member 24. The gas pressure, in this case, acts to lift the sample tube carrier 26 upward. More specifically, the sample tube carrier 26 moves in a direction departing from the sample tube passage member 24.

Figure 18:
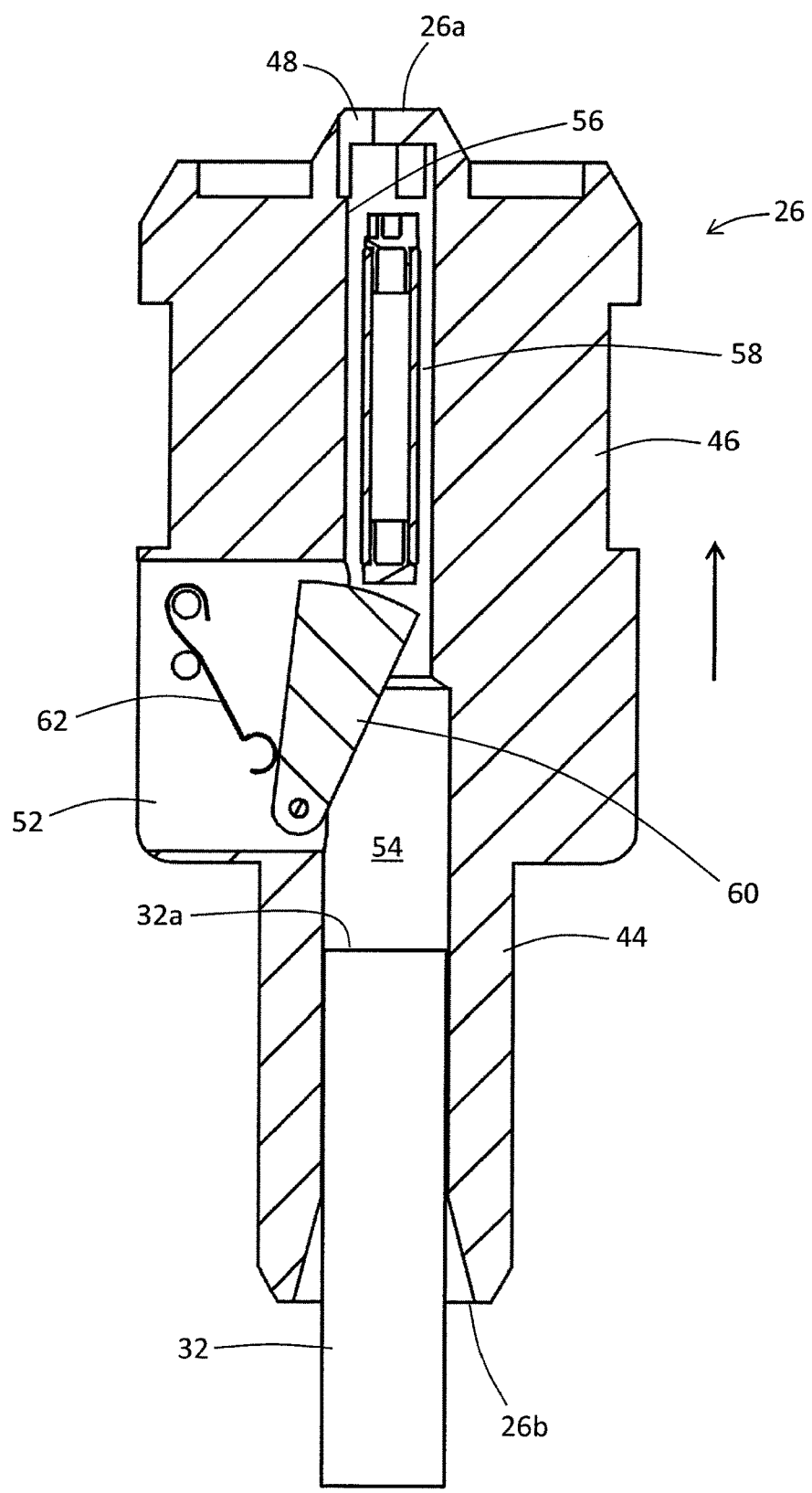
FIG. 18 is a cross-sectional view illustrating the sample tube carrier and the sample tube passage member.

FIG. 18 illustrates the sample tube carrier 26 in a lifted-up state. FIG. 18 is a cross-sectional view illustrating the sample tube carrier 26 and a part of the sample tube passage member 24. When the gas pressure acts to lift the sample tube carrier 26 upward (in the direction of an arrow illustrated in FIG. 18), the upper end 32a of the insertion member 32 is disengaged from the valve 60 and therefore no pushing force is given to the valve 60. On the other hand, the urging force of the spring 62 acts to push the valve 60 toward the boundary between the passage 54 and the housing space 56 in such a way as to bring it into the closed state. As a result, the valve 60 closes the boundary between the passage 54 and the housing space 56, and the sample tube 58 is confined in the housing space 56.

The sample tube carrier 26 is lifted by the gas pressure and taken out from the NMR apparatus 10. An operator may perform a manual operation to take out the sample tube carrier 26. Alternatively, the sample changer may automatically take out the sample tube carrier 26. For example, the gas pressure may act to automatically detach the sample tube carrier 26 from the sample tube passage member 24 and take it out from the NMR apparatus 10.

If the sample tube carrier 26 is configured to have no opening, there will be no path for escape of the gas supplied into the housing space 56 through the sample tube passage member 24. Therefore, if the setting of the gas pressure is inadequate, the sample tube carrier 26 may start moving upward (in the direction departing from the sample tube passage member 24) at early timing and may be unintentionally detached from the sample tube passage member 24 before the sample tube 58 is taken out. To solve such drawback, formed at the upper end 26a of the sample tube carrier 26 is the opening 48 communicating with the housing space 56. When the gas is supplied into the housing space 56, the opening 48 enables the gas to exit to the outside of the sample tube carrier 26. Therefore, the sample tube carrier 26 is not exposed to the gas pressure that is so much higher that the sample tube carrier 26 may be unintentionally lifted upward. As a result, the sample tube carrier 26 does not start moving upward before the sample tube 58 closes the opening 48. In addition, it is designed in such a manner that the sample tube 58 comes into contact with the portion where the opening 48 is formed (more specifically, the upper end 26a of the sample tube carrier 26) when the sample tube 58 is forced into the housing space 56 by the gas stream.

Therefore, the sample tube 58 automatically closes the opening 48 upon moving into the housing space 56.

As mentioned above, according to the present embodiment, an essential requirement to introduce the sample tube 58 into the NMR probe device 16 or collect the sample tube 58 from the NMR probe device 16 is mounting the sample tube carrier 26 on the sample tube passage member 24. Confining the sample tube 58 in the sample tube carrier 26 in both the introducing and collecting operations of the sample tube 58 can facilitate the handling and the management of the sample tube 58 during the introducing and collecting operations.

For example, the operator is not required to grasp the sample tube 58 itself by hand to perform the introducing and collecting operations. Therefore, the problems of dust entering the NMR probe device 16 and contamination of the sample tube caused by manual operations can be solved.

In addition, the sample tube carrier 26 is not fixed to the sample tube passage member 24 in its mounting state and can move upward when exposed to appropriate gas pressure from the bottom. Therefore, when the gas pressure brings the sample tube 58 into contact with the wall surface (more specifically, the upper end 26a) of the housing space 56 in the collecting operation of the sample tube 58, the sample tube carrier 26 moves upward together with the sample tube 58. In other words, the impact due to the contact can be relaxed and the sample tube 58 can be prevented from being damaged.

In addition, since the sample tube 58 itself is a very thin container, even if a character string, a mark, or the like for identification is described on the sample tube 58 itself, reading the character string, the mark, or the like is difficult and distinguishing the sample tube 58 from other tubes is also difficult. In consideration of introducing the sample tube 58 into the NMR probe device 16, describing character strings, marks, or the like on the sample tube 58 itself is not desired, from the viewpoint of eliminating any contamination in the NMR probe device 16. On the other hand, in the present embodiment, an object to which identification information, such as a character string, a mark, or the like, is affixed is the sample tube carrier 26 itself. This can facilitate identification of the sample tube housed in the sample tube carrier 26. As the sample tube carrier 26 itself is not introduced into the NMR probe device 16, no contamination is caused in the NMR probe device 16 even when the identification information is affixed manually (by hand) on an outer surface of the sample tube carrier 26.

In addition, using a plurality of sample tube carriers 26 is useful in facilitating the management of a plurality of sample tubes 58. More specifically, preparing a sample tube carrier 26 dedicated to each sample tube 58 and accommodating each sample tube 58 in the dedicated sample tube carrier 26 can facilitate the management as compared with the case where the sample tube 58 itself is managed.

In addition, owing to the gas pressure acting when collecting a sample tube, the sample tube carrier 26 itself moves upward and the valve 60 automatically closes. Further, the sample tube carrier 26 is automatically detached from the sample tube passage member 24. In other words, it is unnecessary for the operator to perform a manual operation to remove the sample tube carrier 26. The burden imposed on the operator can be reduced. Needless to say, the operator may manually remove the sample tube carrier 26 mounted on the sample tube passage member 24.

The sample tube passage member 24 according to the present embodiment is functionally operable as a passage for introducing the sample tube 58 into the NMR probe device 16 and collecting the sample tube 58 from the NMR probe device 16 and is also functionally operable as a switch for opening and closing the valve 60. Employing the switch configured by the sample tube passage member 24 can simplify the configuration of the locking mechanism. More specifically, the valve 60 and the spring 62 (namely, simplified members) can constitute the locking mechanism (opening/closing mechanism).

As illustrated in FIGS. 10 and 18, when the valve 60 is closed, the valve 60 is disposed at an incline with respect to the passage 54. In the process of collecting a sample tube, the upper end 32a of the insertion member 32 of the sample tube passage member 24 comes into contact with the valve 60 and brings the valve 60 into the opened state. Thus, the sample tube 58 can be discharged into the housing space 56. However, if the setting of the gas pressure is inadequate, the sample tube carrier 26 may start shifting toward an upper position by the gas pressure before the upper end 32a arrives at the valve 60 and the valve 60 may be closed unintentionally. In this case, once the sample tube 58 arrives at the position of the valve 60 by the gas stream, the sample tube 58 collides with the valve 60. The collision force in this case will act to lift the valve 60 upward and enable the sample tube 58 to advance into the housing space 56. When the valve 60 is disposed at an incline with respect to the passage 54, the collision by the sample tube 58 urges the valve 60 to open and the sample tube 58 can be easily discharged into the housing space 56.

In addition, the valve 60 may be configured to have a shape thinning in a direction from the upper side to the lower side so as not to be opened by the gas pressure in the closed state of the valve 60. Such an arrangement enables the gas stream to smoothly flow from the lower side to the upper side and prevents the valve 60 from being opened by the gas pressure. In this manner, after the sample tube 58 is successfully discharged into the housing space 56 and the valve 60 is closed, the valve 60 can be prevented from being opened by the gas pressure and the sample tube 58 can be continuously confined in the housing space 56.

Figure 19:
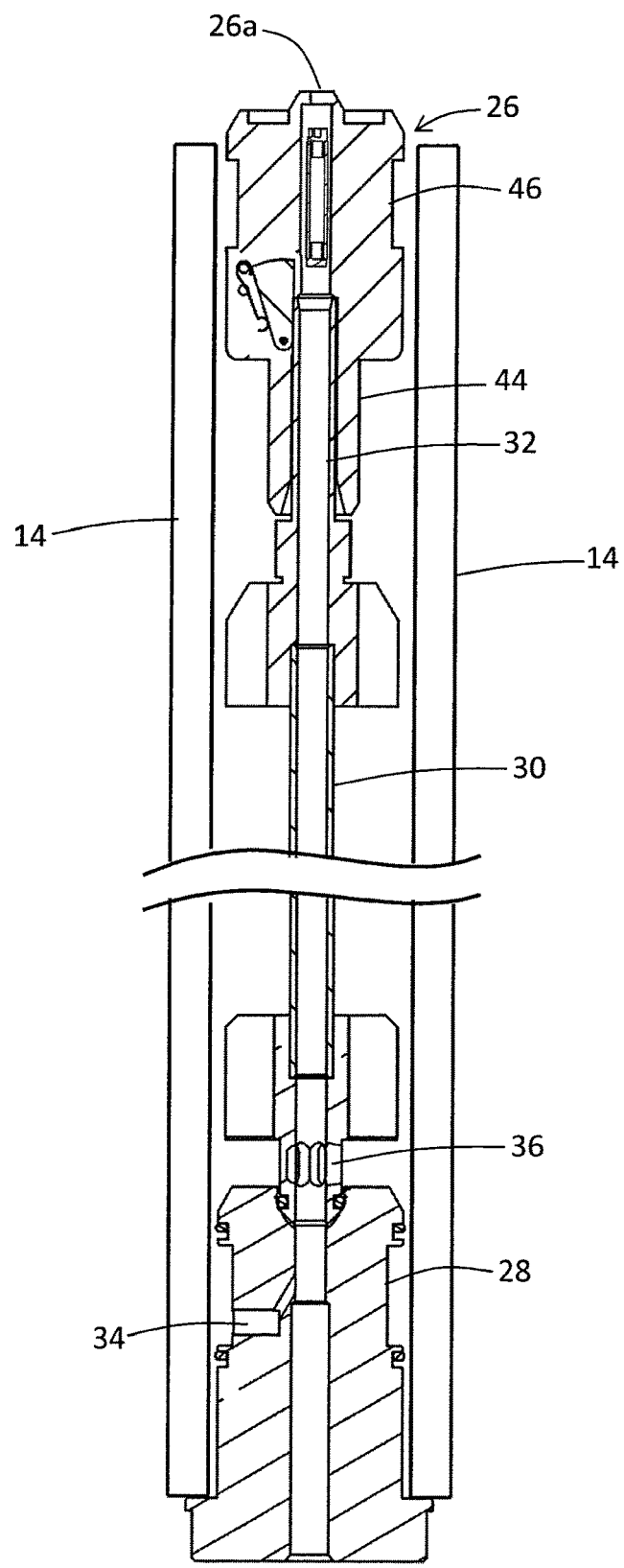
FIG. 19 is a cross-sectional view illustrating a probe guide and a sample tube introducing and collecting apparatus.

Hereinafter, exemplary functions of the through hole 50 of the sample tube carrier 26 will be described in detail below with reference to FIGS. 6 and 19. FIG. 19 is a cross-sectional view illustrating the probe guide 22 and a part of the sample tube introducing and collecting apparatus. The sample tube passage member 24 and the adapter 28 are disposed in the probe guide 22. The gas jetted to the outside of the adapter 28 via the hole 36 of the adapter 28 flows toward the sample tube carrier 26 in the space formed between the probe guide 22 and the sample tube passage member 24. Thus, the gas stream in a direction from the adapter 28 to the sample tube carrier 26 is generated. The generated gas stream induces the force for lifting the sample tube carrier 26 upward. In the present embodiment, since the through holes 50 are located around the sample tube carrier 26 (see FIGS. 6, 9, and 12), the gas stream blown into the sample tube carrier 26 can exit via the through holes 50. Therefore, the force acting on the sample tube carrier 26 can be decreased appropriately so that the sample tube carrier 26 can be prevented from being lifted upward by the gas pressure. If the sample tube carrier 26 does not have any one of the through holes 50, the sample tube carrier 26 is likely to move upward (in the direction departing from the sample tube passage member 24) before the sample tube 58 is taken out and might be undesirably detached from the sample tube passage member 24. In the present embodiment, to solve such a drawback, the through holes 50 each letting the gas escape from the sample tube carrier 26 are formed, so that the force acting to lift the sample tube carrier 26 upward can be lowered adequately.

In addition, thread grooves are formed on the side surface of each through hole 50, and the through hole 50 can be closed with a corresponding screw by tightening the screw into the through hole 50. Closing some of the through holes 50 can block a comparable area of the gas passageway. Therefore, the gas pressure acting on the sample tube carrier 26 increases. Adjusting the number of through holes 50 to be closed leads to adjusting the gas pressure applied on the sample tube carrier 26, as a natural result. For example, to assist the sample tube carrier 26 to shift upward, or to prevent the sample tube carrier 26 from unnecessarily shifting upward, it may be desired to adjust the number of through holes 50 to be closed.

Modified Embodiment 1

Figure 20:
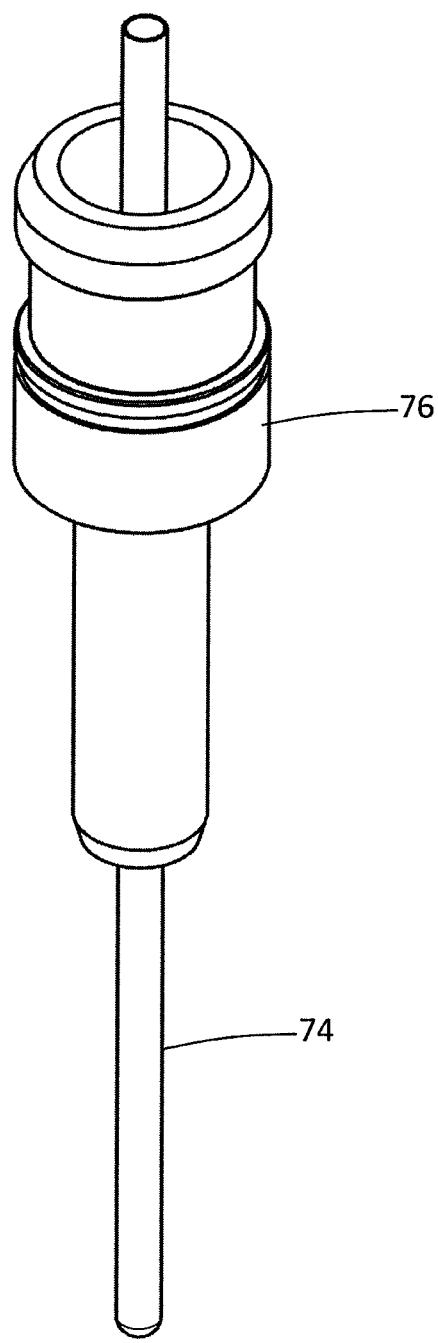
FIG. 20 is a perspective view illustrating a solution NMR rotor.

Hereinafter, a modified embodiment 1 will be described in detail below. A sample tube carrier 26 according to the present embodiment may have an exterior shape common to (identical or similar to) a corresponding solution NMR rotor, serving as a holding member for holding a sample tube dedicated solution NMR (hereinafter, referred to as solution NMR sample tube), for example. FIG. 20 illustrates an exemplary solution NMR rotor. A solution NMR sample tube 74 has, for example, an elongated cylindrical shape with one end opened and the other end closed. A solution sample can be accommodated in the solution NMR sample tube 74. The solution NMR sample tube 74 is held by a solution NMR rotor 76, serving as a holding member, so as to extend through the solution NMR rotor 76. The sample tube carrier 26 may have an exterior shape identical or similar to that of the solution NMR rotor 76. In this case, an automatic sample changer, a conveying apparatus, a storage apparatus, and the like, which are generally used in solution NMR measurement, can be used for automatic installation of the sample tube carrier 26 to the NMR apparatus 10, automatic replacement of sample tube carriers, storage of sample tubes, and the like. More specifically, employing the shape identical or similar to the exterior shape of the generally used solution NMR rotor as the exterior shape of the sample tube carrier 26 enables operators to perform replacement and storage of samples by using the automatic sample changer, the conveying apparatus, the storage apparatus, and the like, which are generally used in the solution NMR measurement.

Figure 21:
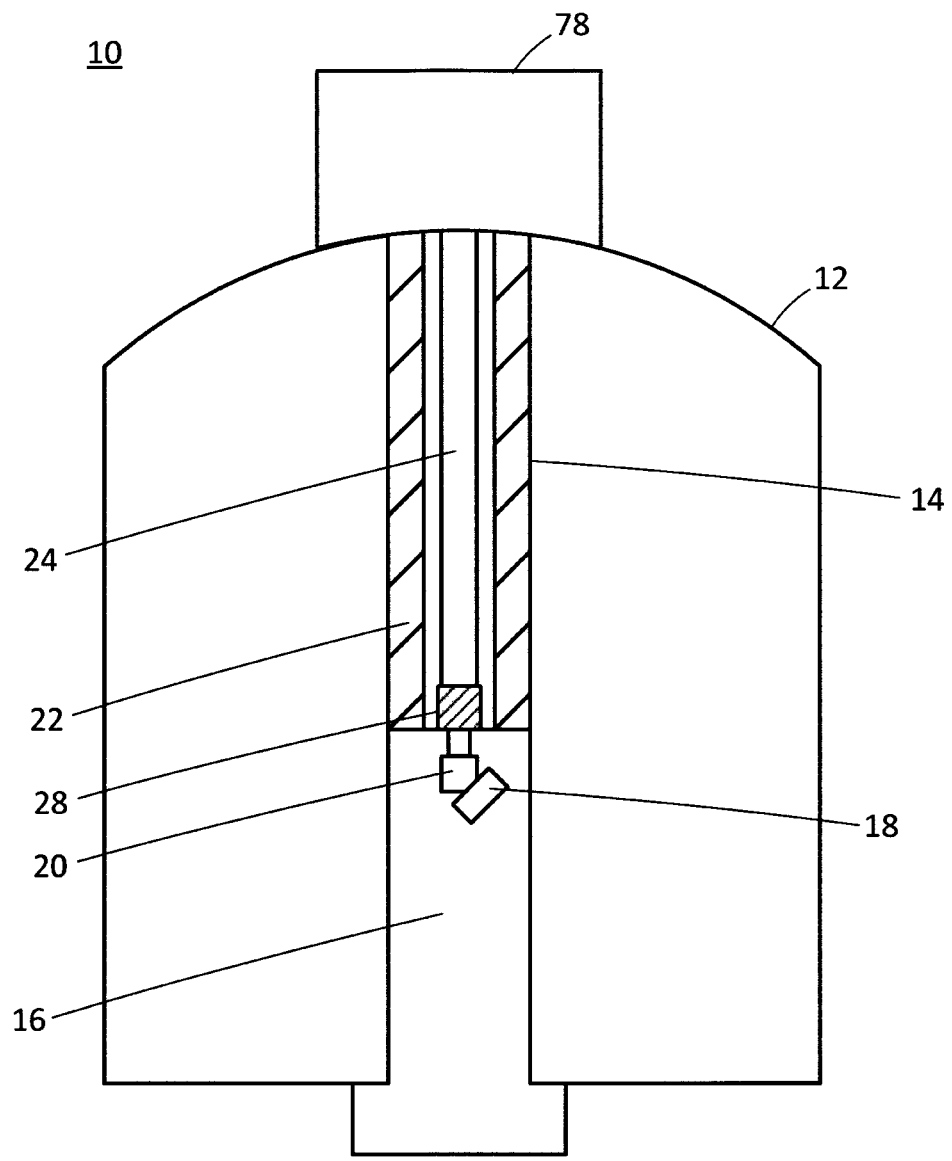
FIG. 21 illustrates an exemplary NMR apparatus according to a modified embodiment 1.

FIG. 21 illustrates the NMR apparatus 10 in a state where an automatic sample changer 78 is installed. The automatic sample changer 78 is attached to the top of the bore 14 of the NMR apparatus 10. The automatic sample changer 78 is an apparatus generally used, for example, in the solution NMR measurement and is configured to hold a plurality of solution NMR sample tubes 74 held by the solution NMR rotor 76. In addition, the automatic sample changer 78 can hold at least one sample tube carrier 26. The automatic sample changer 78 can automatically mount the sample tube carrier 26 on the upper part of the sample tube passage member 24 and can automatically perform replacement of the sample tube carrier 26. Using the automatic sample changer 78 can save labor, because the operator is not required to manually mount the sample tube carrier 26 and replace it.

Figure 22:
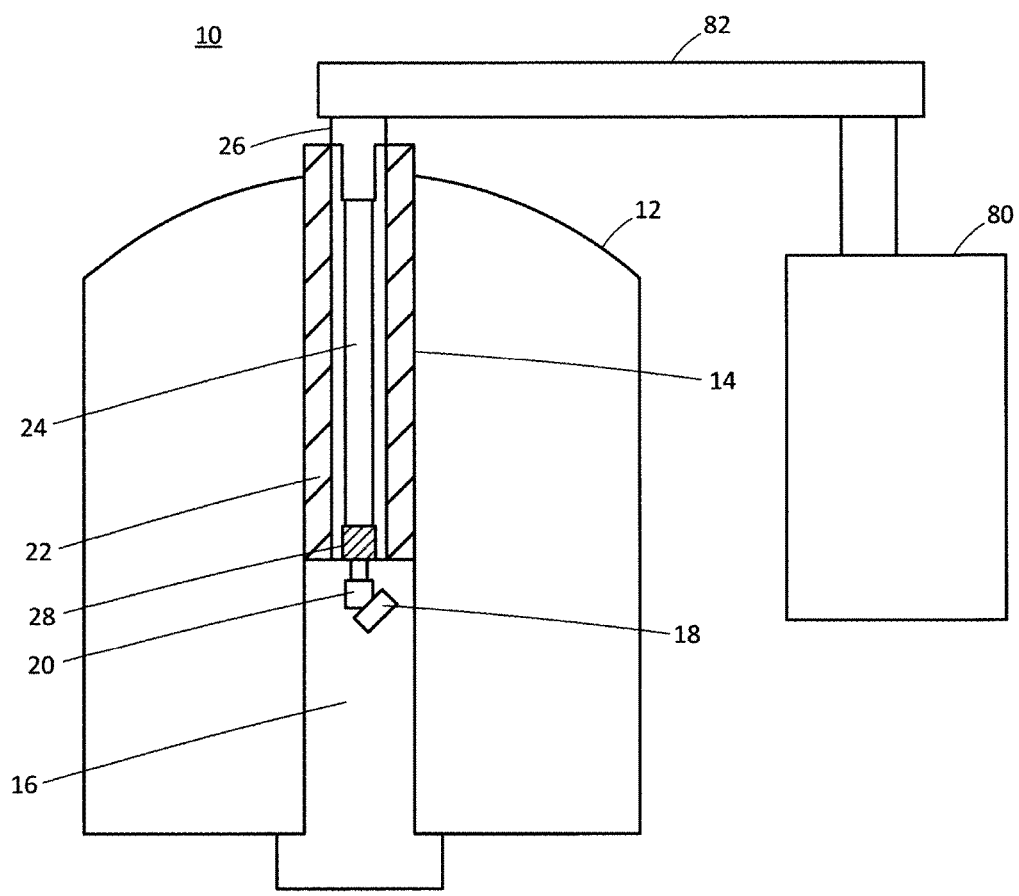
FIG. 22 illustrates another NMR apparatus according to the modified embodiment 1.

FIG. 22 illustrates an exemplary NMR system including a storage apparatus 80 and a conveying apparatus 82. The storage apparatus 80 can store a plurality of sample tube carriers 26 and a plurality of solution NMR sample tubes 74

(held by the solution NMR rotor 76). The storage apparatus 80 has a temperature adjusting function of storing solid samples and solution samples, for example, at desired temperatures determined beforehand. The conveying apparatus 82 can convey each sample tube between the storage apparatus 80 and the top of the bore 14 of the NMR apparatus 10. When measuring a solid sample, the conveying apparatus 82 conveys the sample tube carrier 26 of the measurement target sample from the storage apparatus 80 to the top of the bore 14 and locates the sample tube carrier 26 at the upper part of the sample tube passage member 24. During this conveyance, the sample tube carrier 26 functions as an insulating container. Therefore, suppressing the temperature change of the solid sample adjusted to a desired temperature is feasible. Upon completing the measurement, the conveying apparatus 82 takes out the sample tube carrier 26 from the top of the bore 14 and conveys the sample tube carrier 26 to the storage apparatus 80. Even when performing a solution NMR measurement, the conveying apparatus 82 performs similar operations. Using the storage apparatus 80 and the conveying apparatus 82 as mentioned above can suppress the temperature change of the measurement target sample. Even when the sample tube carrier 26 is manually mounted on the upper part of the sample tube passage member 24 without using the conveying apparatus 82, the sample tube carrier 26 functioning as the insulating container can suppress the temperature change of the solid sample.

Modified Embodiment 2

Figure 23:
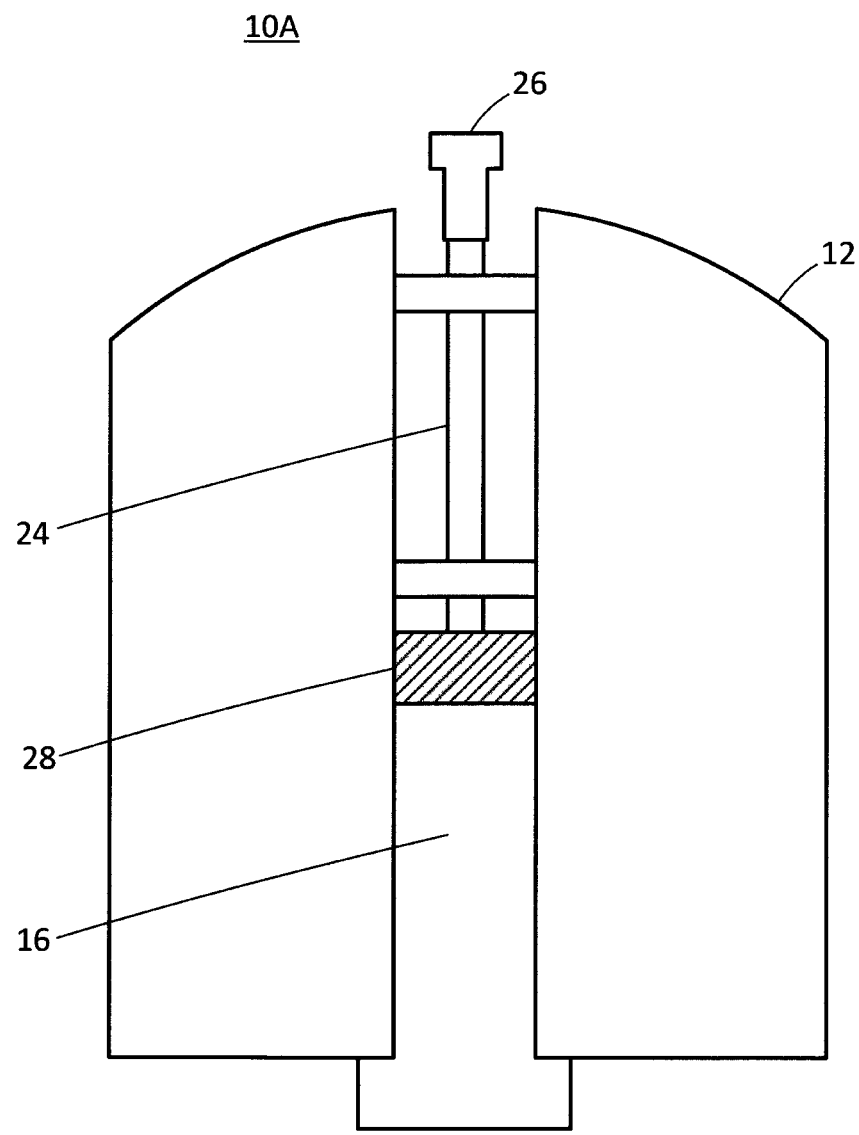
FIG. 23 illustrates an NMR apparatus according to a modified embodiment 2.

Hereinafter, an exemplary NMR apparatus according to a modified embodiment 2 will be described in detail below with reference to FIG. 23. FIG. 23 illustrates an NMR apparatus 10A according to the modified embodiment 2. The NMR apparatus 10A according to the modified embodiment 2 does not include the probe guide 22. Even in this case, the operations for introducing and collecting a sample tube are similar to those of the NMR apparatus 10 according to the above-mentioned embodiment.

Modified Embodiment 3

Figure 24:
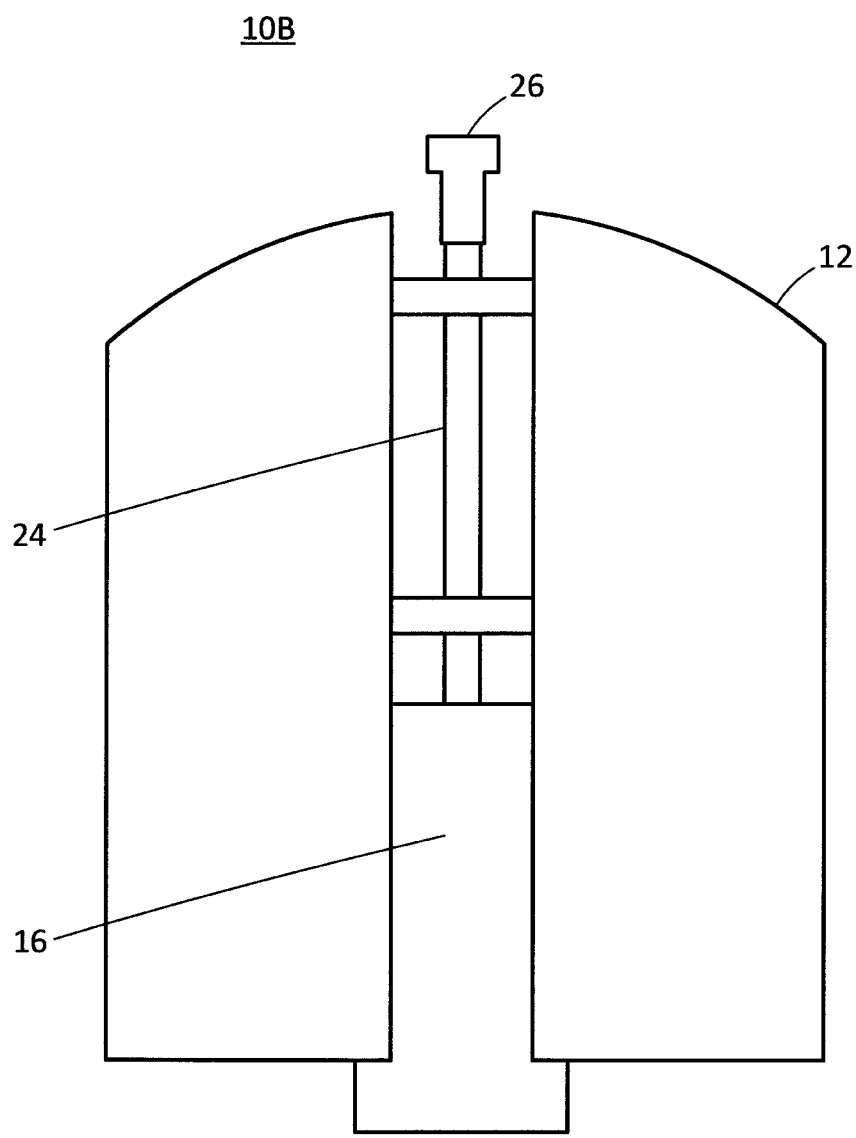
FIG. 24 illustrates an NMR apparatus according to a modified embodiment 3.

Hereinafter, an exemplary NMR apparatus according to a modified embodiment 3 will be described in detail below with reference to FIG. 24. FIG. 24 illustrates an NMR apparatus 10B according to the modified embodiment 3. The NMR apparatus 10B according to the modified embodiment 3 does not include the probe guide 22 and the adapter 28 is disposed in the NMR probe device 16. Even in this case, the operations for introducing and collecting a sample tube are similar to those of the NMR apparatus 10 according to the above-mentioned embodiment.

The invention claimed is:

1. An NMR sample tube introducing and collecting apparatus, comprising:
   a sample tube carrier including a housing space in which a sample tube to be subjected to NMR measurement can be accommodated and a locking mechanism for holding the sample tube in the housing space;
   a sample tube passage having a tubular shape and communicating with an NMR probe device, wherein the sample tube passage is configured to have one end that comes into contact with the locking mechanism and unlocks the locking mechanism when the sample tube carrier is mounted; and
   a jetting member for jetting gas into the sample tube passage so as to flow from the other end of the sample tube passage toward the one end,
   wherein when introducing the sample tube, the sample tube carrier is mounted on the one end and the locking mechanism is unlocked upon the one end coming into contact with the locking mechanism, thereby introducing the sample tube from the housing space into the NMR probe device through the sample tube passage, and
   when collecting the sample tube, in a state where the sample tube carrier is mounted on the one end and the locking mechanism is unlocked, the jetting member jets gas from the other end toward the one end and pressure of the jetted gas acts to discharge the sample tube from the NMR probe device to the housing space through the sample tube passage.

2. The NMR sample tube introducing and collecting apparatus according to claim 1, wherein
   the sample tube carrier further includes a passage connecting the housing space and the outside of the sample tube carrier, and the one end of the sample tube passage can be inserted into the passage of the sample tube carrier when the sample tube carrier is mounted on the one end,
   the locking mechanism is an opening/closing valve provided in the passage of the sample tube carrier,
   when the sample tube carrier is mounted on the one end of the sample tube passage, the one end is inserted into the passage of the sample tube carrier and comes into contact with and pushes the valve to bring the valve into an opened state, and as a result, the housing space and the sample tube passage communicate with each other, and in this state, operations for introducing the sample tube from the housing space into the NMR probe device and collecting the sample tube from the NMR probe device to the housing space can be performed.

3. The NMR sample tube introducing and collecting apparatus according to claim 2, wherein when the sample tube carrier is detached from the one end of the sample tube passage in the state where the sample tube is accommodated in the housing space, the one end of the sample tube passage is disengaged from the valve to bring the valve into a closed state, thereby confining the sample tube in the housing space.

4. The NMR sample tube introducing and collecting apparatus according to claim 2, wherein
   an opening is formed on a wall surface that constitutes the housing space, and
   when collecting the sample tube, pressure of the gas supplied from the jetting member acts to discharge the sample tube into the housing space and close the opening, and as a result, the gas pressure causes the sample tube carrier to move in a direction departing from the one end of the sample tube passage, thereby disengaging the one end from the valve to bring the valve into a closed state.

5. The NMR sample tube introducing and collecting apparatus according to claim 2, wherein the valve is disposed at an incline with respect to the passage.

6. The NMR sample tube introducing and collecting apparatus according to claim 1, wherein at least one through hole for passing the gas jetted from the jetting member to the outside is formed in an outer peripheral region of the housing space.

7. The NMR sample tube introducing and collecting apparatus according to claim 1, wherein when collecting the sample tube, an impact force due to gas pressure acting in discharging the sample tube into the housing space causes the sample tube carrier to shift in a direction departing from the one end of the sample tube passage.

8. The NMR sample tube introducing and collecting apparatus according to claim 1, wherein
the sample tube is a solid NMR sample tube in which a solid sample can be accommodated, and
the sample tube carrier is a member capable of accommodating and holding the solid NMR sample tube in the housing space and having an exterior shape common to a holding member for holding a solution NMR sample tube accommodating a solution sample.

9. The NMR sample tube introducing and collecting apparatus according to claim 8, wherein a common conveying apparatus conveys the sample tube carrier and the solution NMR sample tube held by the holding member from a storage container storing the sample tube carrier and the solution NMR sample tube to an NMR apparatus.

10. The NMR sample tube introducing and collecting apparatus according to claim 9, wherein the storage container has a function of adjusting the temperature of the sample tube.

11. An NMR sample tube introducing and collecting method, comprising the steps of:
when introducing a sample tube to be subjected to NMR measurement, mounting a sample tube carrier including a housing space in which the sample tube is accommodated and a locking mechanism for holding the sample tube in the housing space on one end of a sample tube passage having a tubular shape and communicating with an NMR probe device to cause the one end to come into contact with the locking mechanism and unlock the locking mechanism, and introducing the sample tube from the housing space to the NMR probe device through the sample tube passage in a state where the locking mechanism is an unlocked state; and
when collecting the sample tube, jetting gas into the sample tube passage so as to flow from the other end of the sample tube passage toward the one end in a state where the sample tube carrier is mounted on the one end of the sample tube passage and the locking mechanism is unlocked, thereby causing the gas pressure to discharge the sample tube from the NMR probe device to the housing space through the sample tube passage.

* * * * *